US 6,654,425 B1

(12) United States Patent
Kunisa et al.

(10) Patent No.: US 6,654,425 B1
(45) Date of Patent: Nov. 25, 2003

(54) METHOD AND CIRCUIT FOR DIGITAL MODULATION AND METHOD AND CIRCUIT FOR DIGITAL DEMODULATION

(75) Inventors: Akiomi Kunisa, Kasukabe (JP); Nobuo Itoh, Nagoya (JP); Seiichiro Takahashi, Gifu (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/284,278

(22) PCT Filed: Oct. 9, 1997

(86) PCT No.: PCT/JP97/03632

§ 371 (c)(1),
(2), (4) Date: Jun. 22, 1999

(87) PCT Pub. No.: WO98/17005

PCT Pub. Date: Apr. 23, 1998

(30) Foreign Application Priority Data

Oct. 13, 1996 (JP) .............................. 8-291171
Nov. 10, 1996 (JP) .............................. 8-314306

(51) Int. Cl.⁷ .............................................. H04L 27/04
(52) U.S. Cl. ........................ 375/295; 375/253; 341/58; 341/59
(58) Field of Search ................................ 375/242, 246, 375/253, 290, 295, 296, 319, 360, 377; 367/47, 59, 124.04; 714/752, 753, 755; 300/41, 53; 341/58, 59

(56) References Cited

U.S. PATENT DOCUMENTS

| 4,499,454 A | * | 2/1985 | Shimada ..................... 340/347 |
| 4,609,907 A | | 9/1986 | Adler et al. .......... 340/347 DD |
| 4,728,929 A | | 3/1988 | Tanaka ................. 340/347 DD |
| 4,731,678 A | | 3/1988 | Takeuchi |
| 5,408,500 A | | 4/1995 | Ginzburg et al. ............ 375/288 |
| 5,537,382 A | | 7/1996 | McLaughlin et al. ........ 369/116 |
| 5,579,182 A | * | 11/1996 | Hamai et al. .................. 360/41 |
| 5,815,334 A | * | 9/1998 | Chang .......................... 360/53 |
| 6,079,041 A | * | 6/2000 | Kunisa et al. ............... 714/752 |
| 6,198,710 B1 | * | 3/2001 | Hori et al. ..................... 369/59 |

FOREIGN PATENT DOCUMENTS

| EP | 0 343 930 A2 | 11/1989 |
| EP | 0 415 853 A2 | 3/1991 |
| EP | 0 593 173 A2 | 4/1994 |

(List continued on next page.)

OTHER PUBLICATIONS

Kunisa et al. "A Study of DC Component Suppressing Method for Digital Signal Recording" No. 10, vol. 49, pp. 1361–1364 (1995).

(List continued on next page.)

*Primary Examiner*—Chieh M. Fan
(74) *Attorney, Agent, or Firm*—Armstrong, Westerman & Hattori, LLP

(57) ABSTRACT

A digital modulation method in which at a head of an input block (pre-translation), each of a plurality of different types of initial data of t bits is multiplexed to generate a plurality of different types of multiplexed blocks, t bits at the head and immediately following t bits of each of the multiplexed blocks are subjected to exclusive OR operation, the immediately following t bits are replaced by the result of operation, the replaced t bits and the immediately following t bits are subjected to an exclusive OR operation, and the immediately following t bits are replaced by the result of operation, and thereafter in the similar manner, a convolution operation is executed. A plurality of different types of translated blocks are produced by the convolution operation, and DC components of thus provided translated blocks are calculated, respectively, absolute values of the respective DC components are compared with each other, and a translated block having the minimum value is selected and output externally.

13 Claims, 20 Drawing Sheets

FOREIGN PATENT DOCUMENTS

| | | |
|---|---|---|
| EP | 0 732 698 A1 | 9/1996 |
| EP | 0 886 275 A1 | 12/1998 |
| JP | 52-128024 | 10/1977 |
| JP | 57-132461 | 8/1982 |
| JP | 59-94214 | 5/1984 |
| JP | 59-123343 | 7/1984 |
| JP | 60-69866 | 4/1985 |
| JP | 61-196469 | 8/1986 |
| JP | 1-27510 | 5/1989 |
| JP | 2-94923 | 4/1990 |
| JP | 4-68818 | 3/1992 |
| JP | 6-311042 | 11/1994 |
| JP | 8-46526 | 2/1996 |

OTHER PUBLICATIONS

"A New 8–12 conversion channel Code and Its Application to High Data–Rate Video Recording"—433b Electronics and Communications in Japan, 78(Jul. 1995), No. 7, New York, US, pp. 103–113.

* cited by examiner

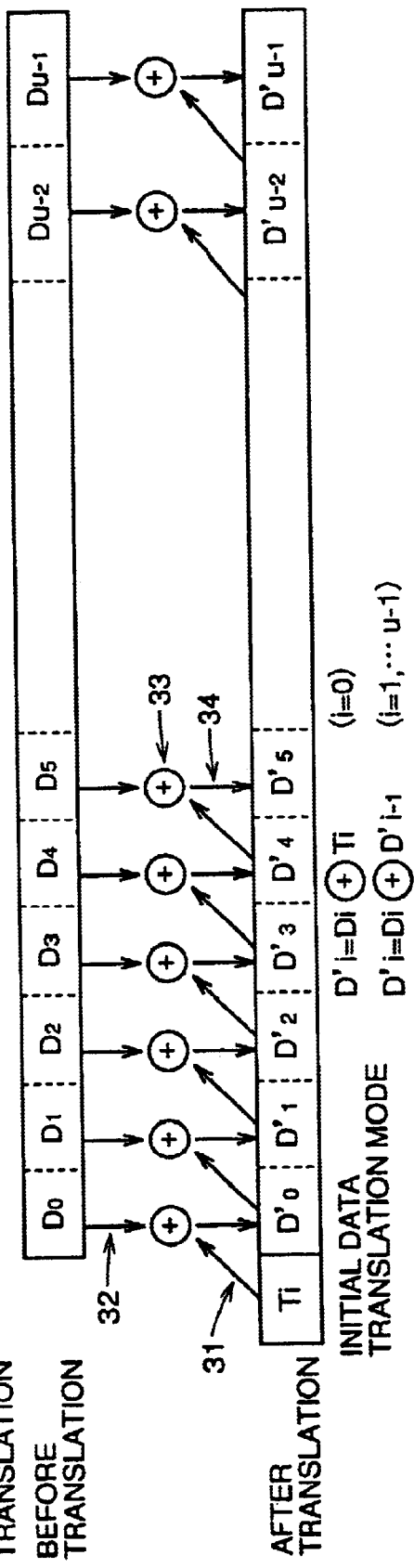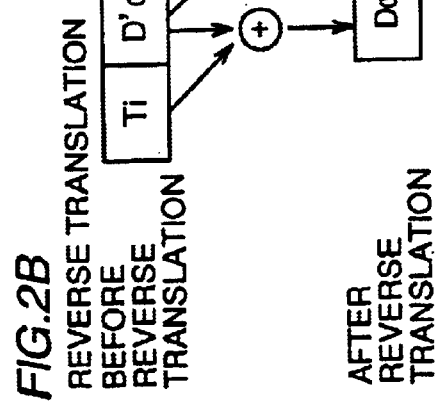

FIG.3

TRANSLATION TABLE

| $T_i$ or $D'_{i-1}$ | $D_i$ | $D'_i$ |
|---|---|---|
| 00 | 00 | 00 |
|    | 01 | 01 |
|    | 11 | 11 |
|    | 10 | 10 |
| 01 | 00 | 01 |
|    | 01 | 11 |
|    | 11 | 10 |
|    | 10 | 00 |
| 11 | 00 | 11 |
|    | 01 | 10 |
|    | 11 | 00 |
|    | 10 | 01 |
| 10 | 00 | 10 |
|    | 01 | 00 |
|    | 11 | 01 |
|    | 10 | 11 |

METHOD AND CIRCUIT FOR DIGITAL MODULATION AND METHOD AND CIRCUIT FOR DIGITAL DEMODULATION

BACKGROUND OF THE INVENTION

1. Field of the Invention

The present invention relates to a digital modulation circuit, a digital modulation method, a digital demodulation circuit and a digital demodulation method. More specifically, the present invention relates to a digital modulation circuit and a digital modulation method for modulating an unknown data sequence to a recording signal waveform sequence or channel sequence to be recorded on a recording medium, and to a digital demodulation circuit and a digital demodulation method for demodulating the signal waveform sequence to a data sequence.

2. Description of the Related Art

A binary data sequence is modulated to an appropriate recording signal waveform sequence and recorded on a recording medium. For example, a binary data sequence is subjected to RLL coding and further to NRZI modulation to be recorded on the recording medium. This enhances recording density. The binary data sequence may sometimes be directly subjected to NRZ modulation or NRZI modulation to be recorded on the recording medium.

In RLL coding, datawords of m bits each are successively cut out from an input data sequence, and each dataword is translated to a codeword each of n bits. This translation has a condition for enlarging a minimum value Tmin and reducing a maximum value Tmax of a time interval between adjacent transitions of the NRZI modulated recording signal. More specifically, there is a condition that in the RLL coded code sequence, the number of bits of "0" existing between a bit "1" and another bit "1" must be at least d and at most k. The RLL code translated to satisfy the condition is referred to as (d, k; m, n) RLL code.

In NRZI modulation, an RLL code is modulated such that bit "1" is inverted and bit "0" is not inverted. Accordingly, bit inversion interval in the signal to be recorded after NRZI modulation becomes wider than the bit inversion interval in the RLL code before NRZI modulation. Therefore, as compared with when the RLL code before NRZI modulation is recorded on a recording medium and reproduced, waveform distortion in the reproduced signal can be reduced when the recording signal after NRZI modulation is recorded on the recording medium and reproduced, and as a result, error in reading can be reduced. When error in recording of approximately the same extent is tolerable, higher recording density can be attained when the recording signal after NRZI modulation is recorded on the recording medium, than when the recording signal before NRZI modulation is on the recording medium.

Desired features of the recording signal waveform sequence are as follows.

(1) Minimum value Tmin of the time interval between adjacent transition of the recording signal Tmin is calculated as a product of "d+1" and duration of channel bit, that is, a detection widow width Tw. When recording density is made higher, inversion interval of recording signals becomes smaller, so that the reproduced signals are more susceptible to distortion because of intersymbol interference. As a result, error in reading is more likely. In order to reduce waveform distortion in reading from a recording medium with high recording density and to reduce error in recording, larger Tmin is desirable.

(2) Maximum value Tmax of the time interval between adjacent transitions of the recording signal Tmax is calculated as a product of "k+1" and the detection window width Tw. A reproduction pulse cannot be obtained unless the polarity is inverted. Therefore, a clock cannot be directly generated from the reproduction pulse, which leads to clocks of lower accuracy. When the interval of polarity inversion becomes longer, there will be much fluctuation in DC component, and therefore smaller Tmax is desirable.

(3) DC component or constant frequency component

A recording apparatus and a reproducing apparatus have an AC coupling device. Therefore, when the recording signal has a DC component, recording signal waveform is distorted in the AC coupling device, which is not desirable. Further, it is not possible to recover in reproduction the DC component lost at the time of recording. Therefore, less DC component and less low frequency component are desired.

For evaluation of the DC component and the low frequency component in the recording signal, DSV (digital Sum Value) is used. DSV represents an accumulated value calculated from the start point of the waveform sequence of the recording signal, with the value of bit "1" regarded as "+1" and the value of bit "0" as "−1". If the absolute value of DSV is small, it means that the DC component or the low frequency component is small. For evaluation of the DC component and the low frequency component of each code, CDS (Codeward Digital Sum) is used. CDS represents DSV in each codeword, and smaller CDS represents smaller DC component or low frequency component of the corresponding codeword.

(4) Detection window width Tw

Detection window width Tw is given by (m/n)T, which represents a time which can be used for detection of a reproduction bit, that is, resolution. Further, the detection window width Tw represents window margin against phase fluctuation of the reproduced signal caused by waveform or intersymbol interference or noise, and larger value is desirable.

(5) Constraint length Lc.

In order to improve Tmin, Tmax and DSV, sometimes coding is performed with reference to preceding and succeeding codewords. The length of the preceding or succeeding codeword referred to at that time is called constraint length Lc. As Lc becomes larger, error propagation becomes larger and circuit configuration becomes more complicated. Therefore, smaller Lc is desired.

Japanese Patent Laying-Open No. 52-128024 discloses a technique for marking Tmin larger and marking Tmax smaller in the recording signal after NRZI modulation. According to this Laid-Open application, by RLL coding in which datawords each of 2 bits are successively cut out from an input data sequence and translated to codewords each of 3 bits, (1, 7; 2, 3) RLL codes are produced. Code sequences of thus produced RLL code are subjected to NRZI modulation. When the condition of d=1 cannot be satisfied, (1, 7; 4, 6) RLL codes are produced.

Japanese Patent Publication No. 1-27510 discloses a technique of coding (RLL coding) for reducing DC component of the recording signal after NRZI modulation is disclosed, in which coding is performed so as not to reduce Tmin of the recording signal after NRZI modulation. According to this published application, blocks each of n bits are successively cut out from a code sequence after coding, and between adjacent blocks, redundancy bits each consisting of a plurality of bits are inserted. The code sequence with redundancy bits inserted is supplied to an NRZI modulation circuit. Here, redundancy bits are selected dependent on whether code inversion is necessary between the blocks to which the redundancy bits are to be inserted, and on the state of the last part of the immediately preceding block. More specifically, the redundancy bits are selected so as to reduce DC component of the NRZI modulated recording signal and not to reduce Tmin.

Further, Japanese Patent Publication No. 5-34747 discloses a coding scheme in which rule of translation, i.e. a look-up table for translating a data sequence to RLL codes is adjusted in accordance with arrangement of data sequence, whereby Tmin of 1.5T, Tmax of 4.5T and Lc of 5T can be attained.

Japanese Patent Publication No. 4-77991 discloses a technique for reducing DC component of the recording signal after NRZI modulation and to enlarge Tmin. According to this published application, datawords each of 8 bits are successively cut out from an input data sequence, and each dataword is translated to codewords each of 14 bits. Translation is performed such that in the translated code sequence, the number of bits of "0" is at least 1 and at most 8 between a bit "1" and another bit "1". There are two tables prepared for translating a dataword of 8 bits to a codeword of 14 bits, and dependent on the DSV at the end of the codeword that is translated immediately before, a codeword of either of the tables is selected. More specifically, selection is made to reduce DC component of the recording signal after NRZI modulation.

Further, Japanese Patent Laying-Open No. 6-311042 discloses a technique for sufficiently reducing DC component of the recording signal after NRZI modulation and to improve recording density DR (density ratio) by enlarging Tmin. According to this Laid-Open application, datawords each of 8 bits are successively cut out from an input data sequence, and each dataword is translated to a codeword each of 17 bits. The translation is performed such that in the translated code sequence, the number of bits "0" existing between a bit "1" and another bit "1" is at least 2 and at most 9.

The aforementioned codeword of 17 bits is obtained by adding redundancy bits of 2 bits, to a code of 15 bits corresponding to the dataword of 8 bits. According to the aforementioned Japanese Patent Laying-Open No. 6-311042, two tables specifying correspondence between the datawords of 8 bits each to codes of 15 bits each are prepared, and three different types of redundancy bits each of 2 bits are prepared. By a 17 bit codeword selected based on the DSV at the end of the data translated immediately before from six different codewords obtained by the combination of these two tables and three different types of redundancy bits, said dataword of 8 bits is replaced. More specifically, said 8 bit dataword is replaced by a 17 bit codeword selected to reduce the DC component of the recording signal after NRZI modulation.

In the techniques disclosed in the aforementioned applications, in order to suppress DC component or low frequency component of the recording signal, a technique of adding redundancy bits or preparing a plurality of translation tables to select an optimal translation table in accordance with the input dataword, for example, are used. Accordingly, the above described condition on "d" or "k" is become less severe, resulting in an inconvenience of Tmin becoming smaller or Tmax becoming larger. As the number of bits of the codeword increases, Tw becomes smaller, causing a problem that the minimum resolution becomes lower.

Therefore, a main object of the present invention is to provide a digital modulation circuit, a digital modulation method, a digital demodulation circuit and a digital demodulation method allowing sufficient suppression of DC component and low frequency component of the recording signal.

Another object of the present invention is to provide a digital modulation circuit, a digital modulation method, a digital demodulation circuit and a digital demodulation method allowing sufficient suppression of DC component and low frequency component of the recording signal while preventing reduction of Tmin or enlargement of Tmax.

A still further object of the present invention is to provide a digital modulation circuit, a digital modulation method, a digital demodulation circuit and a digital demodulation method allowing improvement of resolution by enlarging Tw, while sufficiently suppressing DC component and low frequency component of their recording signal.

A still further object of the present invention is to provide a digital modulation circuit, a digital modulation method, a digital demodulation circuit and a digital demodulation method allowing reduction in error in reproduction and reduction of error propagation in reproduction.

SUMMARY OF THE INVENTION

The present invention provides a method of digital modulation utilizing m-n modulation system in which an arbitrary sequence of m bits in translated to in one to one correspondence to an arbitrary sequence of n bits where (n≧m), for m-n modulating, using every m bits of the input digital data as a unit of code modulation, every m bits to n bits of modulated data, in which at the head of a p-bit input block data consisting of a prescribed number of data translation units (t bits), each of a plurality of different types of t bit data is multiplexed as initial data, whereby a plurality of different types of pre-translation block data are produced. For each of the plurality of different types of pre-translation block data, t bits at the head of the pre-translation block data and immediately succeeding t bits are subjected to exclusive OR operation, the immediately following t bits are replaced by the result of operation, the replaced t bits and immediately following t bits are subjected to exclusive OR operation, and the immediately following t bits are replaced by the result of operation. Thereafter, in the similar manner, convolution operation including the exclusive OR operation and the replacement operation is executed until the end of the pre-translation block data, whereby translated block data are produced from respective pre-translation block data. DC components of respective modulated block data obtained by m-n modulation of the plurality of different types of translated block data are compared with each other, initial data corresponding to that modulated block data which has a small absolute value of the DC component is selected, and m-n modulation block data which corresponds to the pre-translation block data on which the selected initial data has been multiplexed is produced.

More preferably, said selection is performed by specifying the modulated block data having the minimum absolute value of the accumulated value of the DC component at the last bit of the modulated block data.

Further, said selection is performed by specifying the modulated block data having the minimum absolute value of maximum amplitude of the accumulated value of DC component of the modulated block data.

According to another aspect, the present invention provides a digital modulation circuit utilizing m-n modulation system in which an arbitrary sequence of m bits is translated in one to one correspondence to an arbitrary sequence of n bits (where (n≧m), for m-n modulating, using every m bits of the input digital data as code modulation unit, every m bits to modulated data of n bits each, wherein at the head of a p-bit input block data consisting of a prescribed number of data translation units (t bits), each of a plurality of different types of t bit data is multiplexed as initial data, and a plurality of different types of pre-translation block data are produced by a multiplexing circuit. For each of the plurality of different types of pre-translation block data, t bits at the head of the pre-translation block data and immediately following t bits are subjected to exclusive OR operation, and the immediately following t bits are replaced by the result of operation. The replaced t bits and immediately following t bits are subjected to exclusive OR operation, and the immediately following t bits are replaced by the result of operation, and thereafter, in the similar manner, convolution operation including the exclusive OR operation and the replacement operation is executed until the end of the multiplexed block, so that from each pre-translation block data, a translated block data is produced. The DC components of respective modulated block data obtained by m-n modulation of the plurality of different types of translated block data are calculated by a calculating circuit, magnitude of absolute values of respective DC components are compared by a comparing circuit with each other, and initial data corresponding to the modulated block data having small absolute value of the DC component is selected by a selecting circuit, and m-n modulated block data corresponding to the pre-translation block data on which the selected initial data has been multiplexed is produced by the modulation circuit.

More preferably, the selecting circuit selects that initial data which corresponds to the modulated block data having minimum absolute value of the accumulated value of the DC component at the last bit of the modulated block data.

Further, more preferably, the selecting circuit selects that initial data which corresponds to the modulated block data having minimum absolute value of maximum amplitude of the modulated block data.

Further, a memory for storing respective modulated block data is provided, and modulation circuit reads the translated block data corresponding to the initial data selected by the selecting circuit from the memory for m-n modulation.

Further, the input block data is stored in the memory, the input block data is read from the memory, the initial data selected by the selecting circuit is multiplexed by a second multiplexing circuit, for the pre-translation block data output from the second multiplexing circuit, t bits at the head and immediately following t bits are subjected to exclusive OR operation, the immediately following t bits are replaced by the result of operation, the replaced t bits and immediately following t bits are subjected to exclusive OR operation, the immediately following t bits are replaced by the result of operation and, thereafter, convolution operation including the exclusive OR operation and the replacement operation is executed until the end of the pre-translation block data, translated block data is produced from the pre-translation block data by a second data translating circuit, and the modulation circuit performs m-n modulation on the translated block data output from the second data translating circuit.

Further, according to another aspect, the present invention provides a method of digital demodulation in which every n bits of input digital data as a code demodulation unit are subjected to n-m modulation to modulated data of m bits each (where n≧m), wherein demodulated block data consisting of a prescribed number of data reverse translation unit (t bits) are successively produced, t bits at the head of the demodulated block data and immediately following t bits are subjected to exclusive OR operation and the t bits at the head are replaced by the result of operation. The said immediately following t bits and t bits immediately following the immediately following t bits are subjected to exclusive OR operation, and the immediately following t bits are replaced by the result of operation, and thereafter, in the similar manner, convolution operation including the exclusive OR operation and the replacement operation is executed until the end of the demodulated block data, whereby reverse translated block data are produced.

Further, according to a further aspect, the present invention provides a digital demodulation circuit in which every n bits of input digital data as a code demodulation unit are n-m demodulated by a demodulation circuit to m bits (where (n≧m) demodulated data, demodulated block data consisting of a prescribed number of data reverse translation units (t bits) are successively produced, and each data reverse translation unit is held by a latch circuit until replacement operation of the data reverse translation unit is completed. By a reverse translation circuit, t bits at the head of the demodulated block data and immediately following t bits are subjected to exclusive OR circuit, t bits at the head are replaced by the result of operation, the immediately following t bits and t bits immediately following the immediately following t bits are subjected to exclusive OR operation, and said immediately following t bits are replaced by the result of operation and thereafter, in the similar manner, convolution operation including exclusive OR operation and replacement operation is executed until the end of the demodulated block data, and reverse-translated block data are produced.

Further, according to a still further aspect, the present invention provides a method of digital modulation utilizing m-n modulation system in which an arbitrary sequence of m bits is translated in one to one correspondence to an arbitrary sequence of n bits (where n≧m), for n-m modulating, using every m bits of input digital data as a code modulation unit, every m bits to modulated data each of n bits, wherein from immediately preceding translated demodulation code unit or initial data number and from pre-translation demodulation code unit data, translation is performed using a translation table, to translated modulation code unit data, whereby a plurality of different types of block data are produced, DC components of the plurality of different types of block data are compared with each other, and the block data having small absolute value of the DC component is subjected to m-n modulation.

Further, according to a still further aspect of the present invention, at the head of an input block of p bits which is an integer multiple of t bits cut out from an input bit stream, each of a plurality of different types of initial data of t bits is multiplexed by a multiplexing circuit, whereby a plurality of different types of multiplexed blocks are generated, for each of the plurality of different types of multiplexed blocks, t bits at the head of the multiplexed block and immediately following t bits are subjected to exclusive OR operation by an operating circuit, the immediately following t bits are replaced by the result of operation, the replaced t bits and immediately following t bits are subjected to exclusive OR operation, and the immediately following t bits are replaced by the result of operation. Thereafter, in the similar manner, convolution operation including exclusive OR operation and replacement operation is executed until the end of the multiplexed block. The DC component of the plurality of different types of translated blocks produced by the processing of the convolution operation circuit are calculated by a DC component calculating circuit, magnitude of absolute values of respective DC components are compared with each other, and the translated block which has the minimum magnitude of the absolute value is selected by a selecting circuit and output externally.

According to a still further aspect, the present invention provides a digital modulation circuit in which at the head of an input block of which bit number is an integer multiple of t bits cut out from an input bit stream, each of a plurality of different types of t-bit initial data is multiplexed by a multiplexing circuit, whereby a plurality of different types of multiplexed blocks are produced. By a first assigning circuit, the initial data is assigned to a preceding variable at first, and secondly and thereafter, successively applied t-bit translated data are assigned, by a second assigning circuit, current data read t bits by t bits successively from the head excluding the initial data of the multiplexed block are assigned to the current variable, and the preceding variable and the current variable are subjected to exclusive OR operation by a first operating circuit and translated data is produced. The translated data is applied to the first assigning circuit, the current data read successively from the head except the initial data of the multiplexing block are replaced by the translated data by the second operating circuit, by the processing of the first and second assigning circuits and first and second operating circuits, DC components of the plurality of different types of translated blocks produced from the plurality of different types of multiplexed blocks are calculated by a DC component calculating circuit, absolute values of respective DC components are compared with each other, and that translated block which has the minimum magnitude is selected by a selecting circuit and output externally.

Further, according to a still further aspect, the present invention provides a digital modulation circuit in which input blocks of which bit number is an integer multiple of t bits are successively cut out from an input bit stream by an input block producing circuit, a plurality of different types of initial data of t bits are produced by an initial data producing circuit, initial data is assigned to the preceding variable by a first assigning circuit at first, and secondary and thereafter, t bits of translated data applied successively are assigned, and by the second assigning circuit, current data read t bits by t bits successively from the head of the input block are assigned to the current variable. The preceding variable and the current variable are subjected to exclusive OR operation by the first operating circuit and translated data is produced, the translated data is applied to the first assigning circuit, and the current data read successively from the head of the input block is replaced by the translated data, by the second operating circuit. By the processings of the first and second assigning circuits and the first and second operating circuits executed on the plurality of different types of initial data, a plurality of different types of translated blocks are produced, of which DC components are calculated by the DC component calculating circuit, absolute values of respective DC components are compared with each other, and that translated block which has the minimum magnitude is selected by the selecting circuit and output externally.

Further, more preferably, the translated block is modulated to a recording signal block of a prescribed system by the modulation circuit, the DC component calculating circuit calculates each of the DC components when the plurality of different types of translated blocks are modulated to recording signal blocks respectively, and the selecting circuit output the selected translated block to the modulation circuit.

Further, more preferably, the DC component calculating circuit calculates the accumulated value of the DC components of the translated blocks.

According to a still further aspect, the present invention provides a digital modulation method in which at the head of an input block of which number of bits is an integer multiple of t bits cut out from an input bit stream, each of a plurality of different types of t-bit initial data is multiplexed, so that a plurality of different types of multiplexed blocks are produced, for each of the plurality of different types of multiplexed blocks, t bits at the head of the multiplexed block and immediately following t bits are subjected to exclusive OR operation, the immediately following t bits are replaced by the result of operation, the replaced t bits and immediately following t bits are subjected to exclusive OR operation and the immediately following t bits are replaced by the result of operation. Thereafter, in the similar manner, convolution operation including exclusive OR operation and the replacement operation is executed until the end of the multiplexed block, DC components of the plurality of different types of translated blocks produced by the convolution operation are calculated, magnitudes of absolute values of respective DC components are compared with each other, and that translated block which has the minimum magnitude is selected and externally output.

More preferably, comparison of the DC components is performed based on the DC components when the plurality of different types of translated blocks produced by the convolution operation are modulated to the recording signal blocks of the prescribed recording system. The DC component to be calculated is the accumulated value of the DC components at the last bit of the translated block. Further, the DC component to be calculated is a maximum amplitude of the accumulated value of the DC components of the translated block.

Further, according to a still further aspect, the present invention provides a digital demodulation circuit in which input block of a prescribed number of bits starting with initial data of t bits is cut out from an input bit stream, t bits at the head of the input block and immediately following t bits are subjected to exclusive OR operation, and the t bits at the head are replaced by the result of operation. The immediately following t bits and t bits immediately following the immediately following t bits are subjected to exclusive OR operation, the immediately following t bits are replaced by the result of operation, and thereafter, in the similar manner, convolution operation including exclusive OR operation and replacement operation is executed until the end of the input block, whereby reverse-translated block of the input block is produced.

According to a still further aspect, the present invention provides a digital demodulation method in which an input block of a prescribed bit number starting with initial data of t bits is cut out from an input bit stream, t bits at the head of the input block and immediately following t bits are subjected to exclusive OR operation, the t bits at the head are replaced by the result of operation, the immediately following t bits and t bits immediately following the immediately following t bits are subjected to exclusive OR operation, and said immediately following t bits are replaced by the result of operation and, thereafter, in the similar manner, convolution operation including exclusive OR operation and replacement operation is executed until the end of the input block, whereby reverse-translated block of the input block is produced.

Preferably, the number of bits t of the initial data is selected to be in the range of 2 bits $\leq t \leq 8$ bits, assuming that the input block has the data length of 80 bytes.

Further, the number of bits t of the initial data and the number of bits p of the input block which is an integer multiple of the bit number t are selected to satisfy the relation of $0.003 \leq t/p \leq 0.015$.

BRIEF DESCRIPTION OF THE DRAWINGS

FIGS. 2A and 2B are illustrations representing translation and reverse translation by convolution operation shown in FIGS. 1A and 1B.

FIG. 3 shows an example of data translation and reverse translation using a translation table.

DETAILED DESCRIPTION OF THE PREFERRED EMBODIMENTS

Figure 1A:
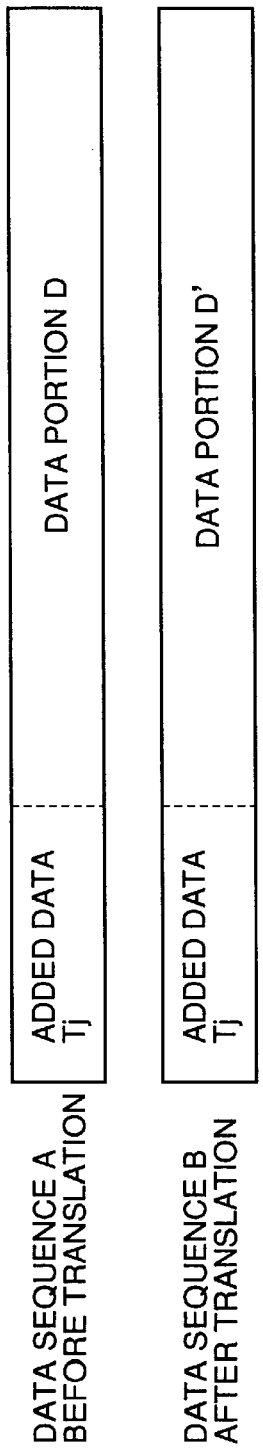
FIGS. 1A and 1B are illustrations representing concept of the present invention.
Figure 1B:
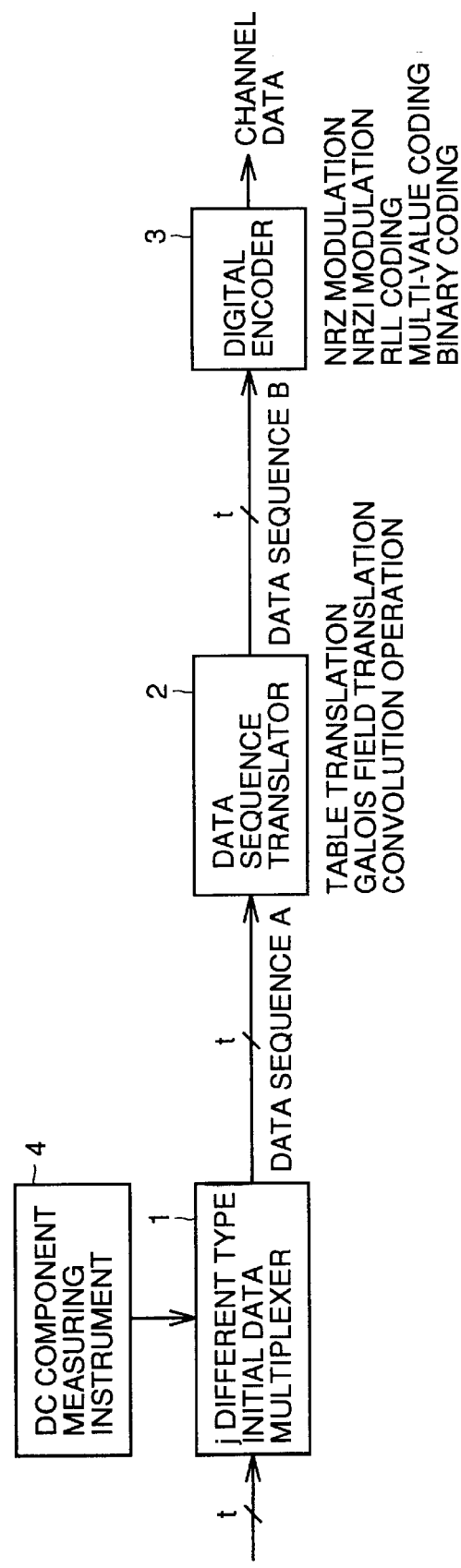

FIGS. 1A and 1B are illustrations representing the concept of the present invention.

According to the present invention, a pre-translation data sequence A on which initial translation data is multiplexed by a j different types of initial data multiplexer 1 shown in FIG. 1A is applied to a data sequence translator 2 shown in FIG. 1B where convolution operation takes place to produce a translated data sequence B shown in FIG. 1A, and a desired recording waveform sequence is produced by a digital encoder 3. Here, initial data selection information which minimizes DC component (absolute value of DSV) in the recording waveform sequence is applied in advance by a DC component measuring instrument 4 to data sequence translator 2, so that a recording block having minimum DC component is output.

FIGS. 2A and 2B are illustrations representing translation and reverse translation by convolution operation shown in FIGS. 1A and 1B. In FIG. 2A, respective data $D_0$ to $D_{u-1}$ represent data each consisting of t bits. Here, t bits may or may not be equal to m bits which are the unit of RLL modulation. RLL modulation may not be performed.

At the time of data translation, at the head of data of each of the blocks, j different types of initial data (translation number $T_j$) are assigned and multiplexed by first assigning means 31, and j different types of pre-translation block data are produced. The j different types of pre-translation block data are assigned by the second assigning means 32 to first operating means 33, starting from the leading code modulation unit except for initial data Tj, a current code modulation unit which is an object of translation and code modulation unit immediately preceding the current code modulation unit (initial data or translated code modulation unit) are subjected to exclusive OR operation by the first operating means 33, and data consisting of the current code modulation units (each of t bits) are operated by second operating means 34. The second operating means 34 also performs a process for setting the result of convolution operation as a preceding variable for the next convolution operation.

At the time of data translation, at the head of data of each of the blocks, j different types of initial data (translation number $T_j$) is assigned and multiplexed by first assigning means 31, and j different types of pre-translation block data are produced. The j different types of pre-translation block data are assigned by the second assigning means 32 to first operating means 33, starting from the leading code modulation unit except for initial data Tj, a current code modulation unit which is an object of translation and code modulation unit immediately preceding the current code modulation unit (initial data or translated code modulation unit) are subjected to exclusive OR operation by the first operating means 33, and replaced, by second operating means 34, with the current code modulation unit (convolution operation). The second operating means 34 also performs a process for setting the result of convolution operation as a preceding variable for the next convolution operation.

Consequently, j different types of translated block data are generated. More specifically, for each of j different types of pre-translation block data (multiplexed blocks), by mod2 operation of the head code modulation unit $D_0$ and initial data $T_j$, translated data $D'_0$ of the head code modulation unit except for the initial data is produced, which replaces $D_0$. Thereafter, by mod2 operation of the above described translated code modulation unit data $D'_0$ and the succeeding code modulation unit $D_j$, the next translated data $D'_1$ is produced in the similar manner, which replaces $D_1$. Thereafter, in the similar manner, convolution operation including exclusive OR operation and replacement operation is repeated until the last code modulation unit of the corresponding block.

In other words, for each of the j different types of pre-translation block data (multiplexed blocks), t bits at the head of the pre-translation block data and immediately following t bits are subjected to exclusive OR operation, the immediately following t bits are replaced by the result of operation, the replaced t bits and immediately following t bits are subjected to exclusive OR operation, the said immediately following t bits are replaced by the result of operation and thereafter, in the similar manner, convolution operation including the exclusive OR operation and the replacement operation is executed until the end of the pre-translation block data, whereby respective translated block data are produced from respective pre-translation block data (multiplexed blocks).

At the time of data reverse-translation, as can be seen from FIG. 2B, starting from the demodulation code unit except for the leading modulation code unit (translation number $T_j$) of the pre-reverse-translation block data, the current demodulation code unit which is an object of reverse-translation and a demodulation code unit immediately preceding the current demodulation code unit (initial data or pre-reverse-translation demodulation code unit) are subjected to exclusive OR operation and the current demodulation code unit is replaced (convolution operation), and accordingly, reverse-translated block data is produced. More specifically, by mod2 operation of the head demodulation code unit $D_0$ and initial data $T_j$, reverse-translated data $D_0$ is produced, which replaces $D'_0$. By mod2 operation of the aforementioned $D'_0$ (pre-reverse-translation demodulation code unit) and the next demodulation code unit $D'_1$, the next reverse-translated data $D_1$ is produced in the similar manner, which replaces $D'_1$. Thereafter, in the similar manner, the process is repeated until the last demodulation code unit of the corresponding block.

In other words, the t bits at the head of the input block contributing to data reverse-translation ("before reverse translation" of FIG. 2B) and immediately following t bits are subjected to exclusive OR operation, the t bits at the head are replaced by the result of operation, the said immediately following t bits and t bits following the said immediately following t bits are subjected to exclusive OR operation and the said immediately following t bits are replaced by the result of operation and thereafter, in the similar manner, convolution operation including the exclusive OR operation and the replacement operation is executed until the last of the input block, whereby the reverse-translated block of the input block is produced.

In this manner, at the time of data reverse-translation, as one immediately preceding pre-translation demodulation code unit is used for reverse-translation of the current demodulation code unit, even when an error generates, the influence thereof is expanded only within the said demodulation code unit and not propagated to succeeding demodulation code units. For example, when an error generates in the pre-reverse-translation demodulation code unit $D'_i$, the influence of the error propagates only to the reverse-translated demodulation code unit $D_i$ and the unit $D_{i+1}$.

FIG. 3 shows an example of data translation and reverse-translation using a translation table. FIG. 3 represents a 2 bit translation table, which allows translation using four different types of Tj at most. More specifically, by using the translation table shown in FIG. 3, it is possible to find the translated demodulation code unit $D'_i$, from immediately preceding translated demodulation code unit $D'_{i-1}$ or initial data number Tj and pre-translation demodulation code unit $D_i$. When RLL coding is to be performed after translation, generally, (d, k; m, n) RLL modulation may be performed on m bits of the sequence of demodulation code unit $D'_i$ of FIG. 3, and more specifically, data translation·reverse translation may be performed using 3 bit data after (a, k: 2, n) RLL modulation in place of 2 bits of data. In this case also, the error propagates only to $D_i$ and $D_{i+1}$.

Figure 4A:
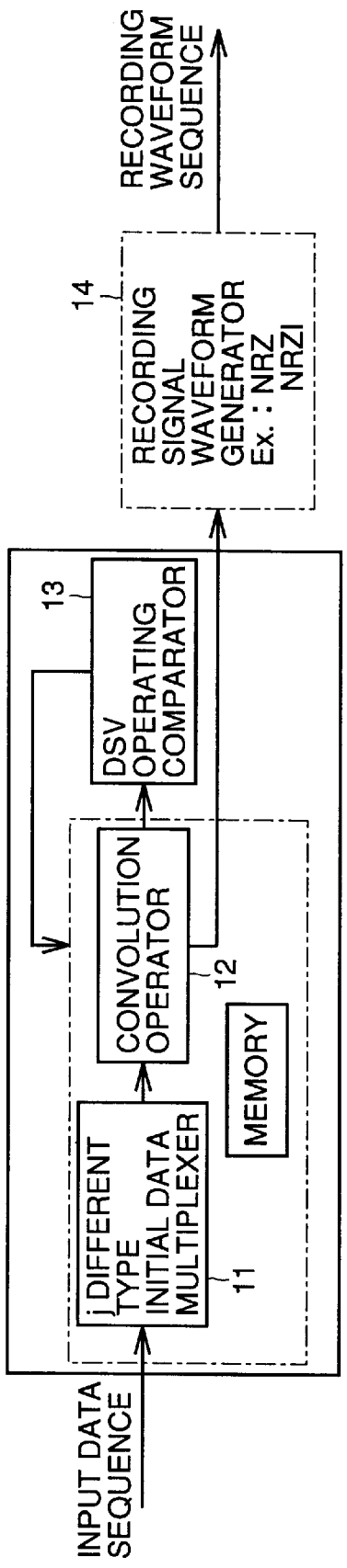
FIGS. 4A and 4B are schematic block diagrams of an embodiment of the present invention.
Figure 4B:
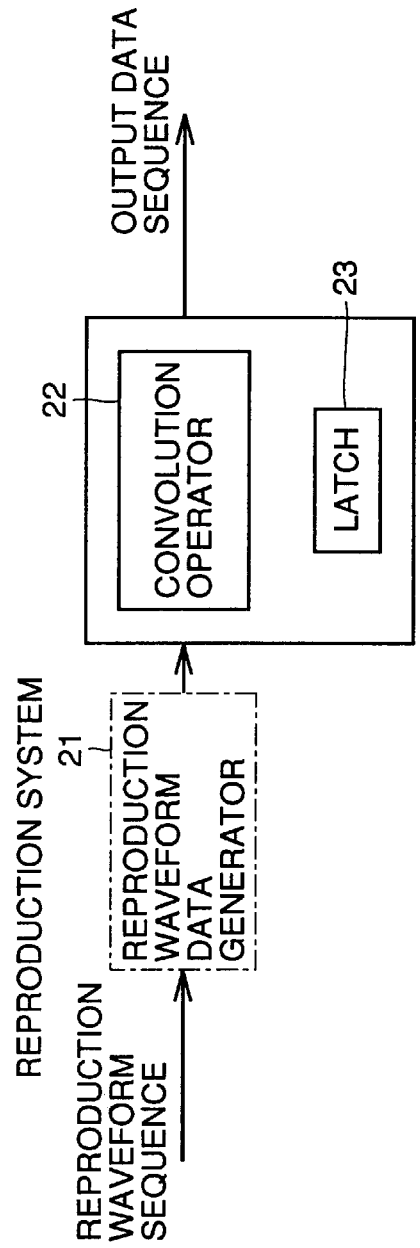

FIGS. 4A and 4B are schematic block diagrams of an embodiment of the present invention.

In a recording system shown in FIG. 4A, an input data sequence is multiplexed by j different types of initial data Tj by j different type initial data multiplexer 11, convolution operation is performed by convolution operator 12, and DSV absolute values are compared by a DSV operating comparator 13. The translated block which has the minimum absolute value by comparison is selected, and subjected to NRZ modulation or NRZI modulation by a recording signal waveform generator 14 to be used as a recording waveform sequence.

In a reproduction system shown in FIG. 4B, a reproduced waveform sequence is translated to data by a reproduction waveform data generator 21, subjected to convolution operation by a convolution operator 22 and output as an output data sequence.

Figure 5A:
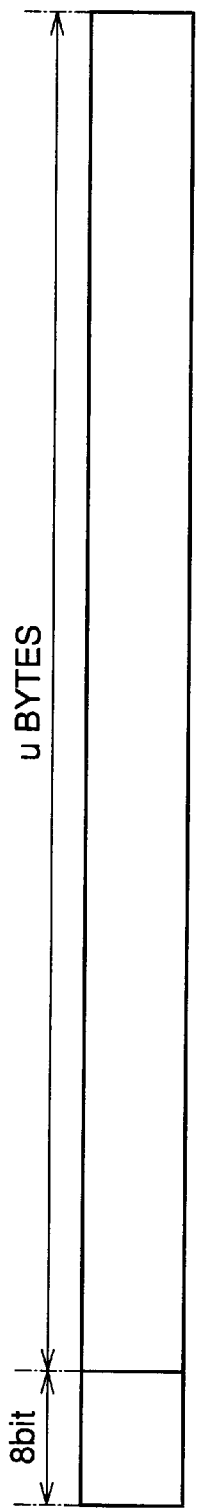
FIGS. 5A to 5D represent an example in which initial data are distributed to input block by convolution operation.
Figure 5B:
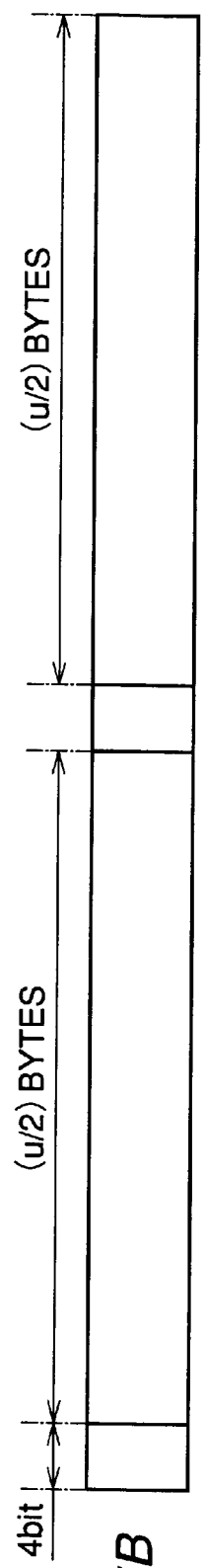
Figure 5C:
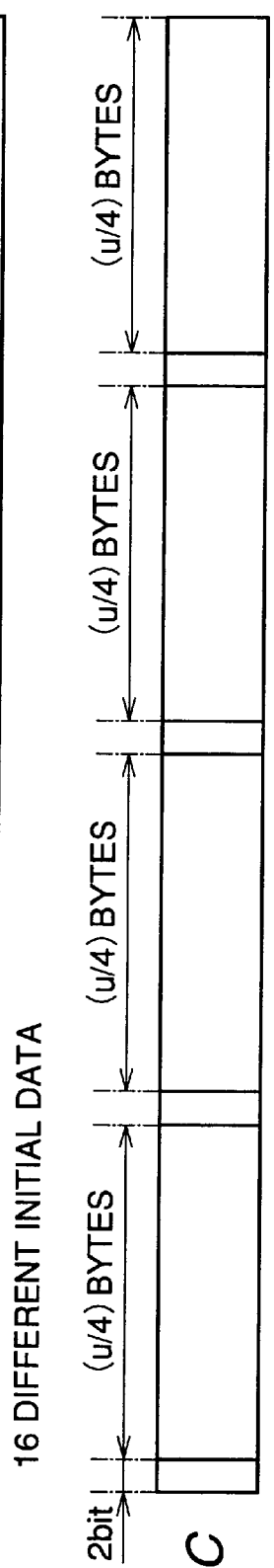
Figure 5D:
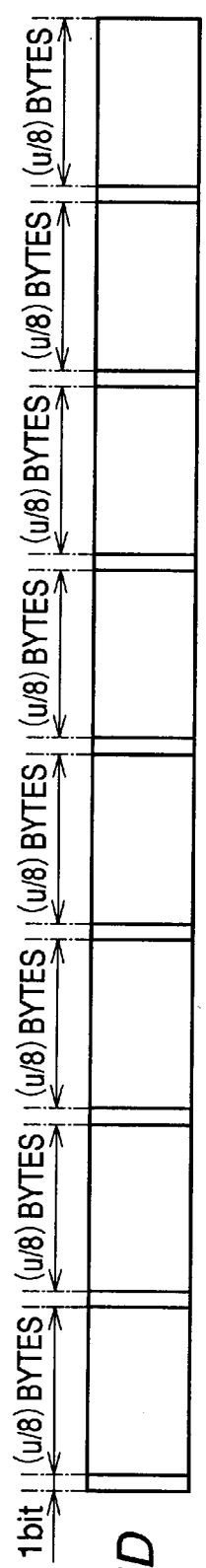

FIGS. 5A to 5D represent examples of distribution of initial data to input blocks by convolution operation. In the example shown in FIG. 1B, j different types of initial data Tj are multiplexed at the head of the input block. In the examples shown in FIGS. 5A to 5D, the initial data are multiplexed distributed within the block. More specifically, FIG. 5A shows an example in which 8 bits of initial data are multiplexed at the head of the input block, FIG. 5B shows an example in which the initial data are distributed 4 bits by 4 bits at two portions to be multiplexed, FIG. 5C shows an example in which the data are distributed 2 bits by 2 bits at four portions to be multiplexed and FIG. 5D shows an example in which the data are distributed bit by bit at eight portions to be multiplexed. Data translation efficiency is the same in any of these examples.

Though degree of suppression of the DC component is approximately the same in FIGS. 5A and 5B, the amount of operation in FIG. 5B is smaller than FIG. 5A, and the circuit configuration is more simple. Namely, when the example of FIG. 5B having the same data translation efficiency as the example of FIG. 5A is employed, sufficient effect of suppressing DC component can be attained by a relatively simple circuit.

The initial data are divided into z as shown in the examples of FIGS. 5A to 5D described above, it is reasonable to set the number of bits of each input divided block P=p/z and bit number of the divided initial data added to the head of each input divided block T=t/z to satisfy the range of "$0.003 \leq T/p \leq 0.015$".

Figure 6:
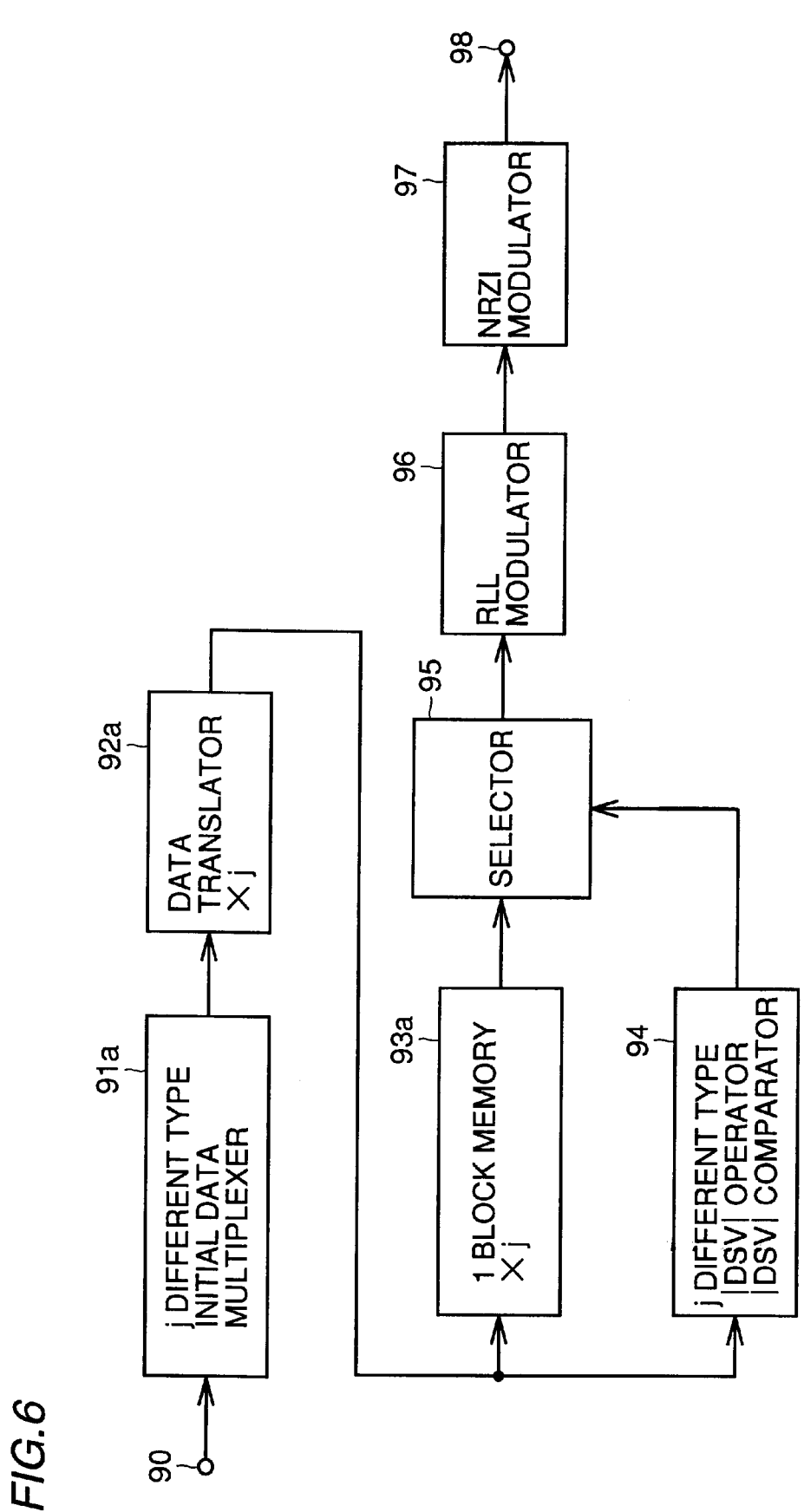
FIG. 6 is a block diagram of a modulator in accordance with another embodiment of the present invention.

FIG. 6 is a block diagram of a modulator in accordance with another embodiment of the present invention. Referring to FIG. 6, an input block data of which code modulation unit consists of t bits are input from an input terminal 90, and at the head of each one block, each of j different types of initial data of t bits (translation number Tj) is multiplexed by a j different type initial data multiplexer 91a, so that j different types of multiplexed blocks (pre-translation block data) are produced. Here, one block (p bits=t bits×z) represents data ratio constituted by a prescribed number of code modulation units (t bits data), which serves as a unit for comparing magnitude of the absolute value of DSV.

For each of the j different types of multiplexed blocks (pre-translation block data) at the head of which j different types of initial data (translation number Tj) are multiplexed, data translation by the convolution operation described with reference to FIG. 2 above is performed by a data translator 92a, whereby j different types of translated block data are produced. Data translator 92a includes first and second assigning means 31, 32 and first and second operating means 33, 34 described with reference to FIG. 2.

The j different types of translated block data are each stored in one block memory 93a and input to a j different type |DSV| operator·comparator 94. In the j different type |DSV| operator·comparator 94, absolute values of DSV when the j different types of translated block data are each subjected to RLL modulation and NRZI modulation are compared with each other, and a translated block data which has minimum absolute value of DSV is selected.

When the translated block data having minimum absolute value of DSV is selected, information representing the result of selection is transmitted to a selector 95. Selector 95 reads the translated block data corresponding to the result of selection (the translated block data having the minimum absolute value of DSV) from the one block memory 93a and inputs the data to RLL modulator 96. Consequently, datawords of m bits are successively cut out from the data sequence by RLL modulator 96, each dataword is translated to a codeword of n bits and RLL modulated, and thereafter NRZI modulation is performed by an NRZI modulator 97.

It should be noted that FIG. 6 represents a circuit for modulating an input block to a recording waveform sequence by RLL modulation and NRZI modulation, and therefore as the DSV absolute value to be compared, the DSV absolute value when each translated block data is subjected to RLL modulation and NRZI modulation is employed. This is a condition particular to the circuit shown in FIG. 6. For example, when the translated block produced by convolution operation is to be recorded directly as shown in FIG. 4A above, the absolute value of DSV of j different types of translated blocks may be compared, the translated block having minimum absolute value of DSV may be selected and it may be used as a recording waveform sequence by NRZ modulation or NRZI modulation. In that case, the detection window width Tw can be enlarged and therefore reproduction resolution is improved. In this manner, the object of which DSV is operated to suppress the DC component may be determined dependent on the desired recording waveform sequence. The same applies when it is used for the communication system.

Figure 7:
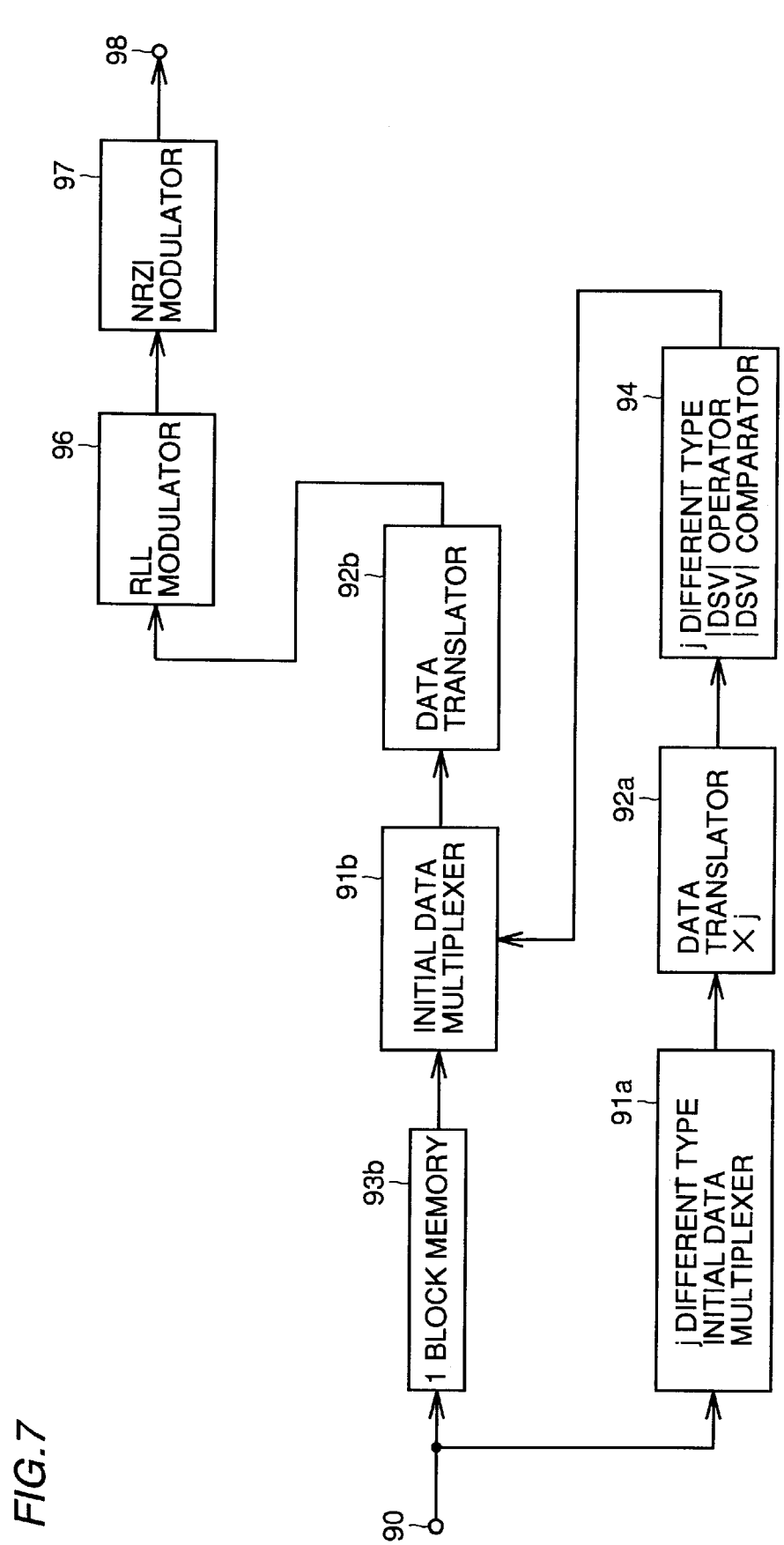
FIG. 7 is a block diagram showing another specific example of the modulator.

FIG. 7 is a block diagram showing another specific example of the modulator.

The present embodiment is provided in order to reduce the number of one block memories. More specifically, in the specific example shown in FIG. 6 above, j different translated block data translated by using j different initial data (translation number Tj) are stored in 1 block memories 93a, and therefore 1 block memories 93a as a whole must have the capacity of j blocks. In view of this, in the present embodiment, only 1 block of capacity is required for 1 block memory 93b, as the multiplexed block (pre-translation block data) is stored. In the following, detailed description of portions similar to the specific example of FIG. 6 are not repeated.

The input block data input through input terminal 90 is stored in 1 block memory 93b as well as to j different type initial data multiplexer 91a. In the j different type initial data multiplexer 91a, each of j different types of initial data (translation number Tj) is multiplexed. Thus, j different types of pre-translation block data (multiplexed blocks) are produced. The j different types of pre-translation block data are input to data translator 92a to be subjected to the above described convolution operation to be j different types of translated block data, absolute values of DSV after RLL modulation and NRZI modulation thereof are compared with each other by j different type |DSV| operator·comparator 94, and a translated block data having the minimum absolute value of DSV is detected. Initial data (translation number Tj) corresponding to the detected translated block data is selected, and the result of selection is applied to initial data multiplexer 91b.

When the result of selection is input, initial data multiplexer 91b multiplexes the selected initial data (translation number Tj) at the head of input block data read from 1 block memory 93b, and applies the result to data translator 92b. Accordingly, data translator 92b performs data translation in accordance with the above described convolution operation, whereby the translated block data is produced. The translated block data is subjected to RLL modulation by an RLL modulator 96, and further to NRZI modulation by an NRZI modulator 97 and output.

When modulation to the recording waveform sequence by RLL modulation and NRZI modulation is not performed, the object of comparison of DSV absolute value is appropriately changed dependent on the recording method employed, similar to the embodiment of FIG. 6 described above.

Figure 8:
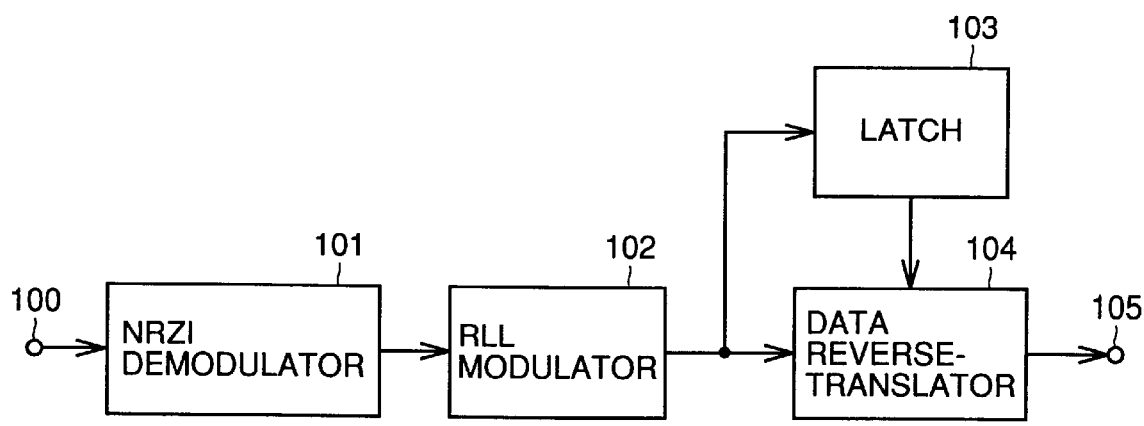
FIG. 8 is a block diagram of a demodulator in accordance with an embodiment of the present invention.

FIG. 8 is a block diagram of a demodulator in accordance with an embodiment of the present invention. The data input to the demodulator shown in FIG. 8 is first applied to an NRZI demodulator 101 to be subjected to NRZI demodulation, and thereafter to an RLL demodulator 102 to be subjected to RLL demodulation. The RLL demodulated data (pre-reverse-translation data) are applied to latch 103 and held therein, as well as to data reverse-translator 104. In data reverse-translator 104, from delayed data input from latch 103 (immediately preceding demodulation code unit) and data which is the object of reverse-translation input from RLL demodulator 102 (current demodulation code unit), reverse-translation in accordance with convolution operation described above takes place. Consequently, the data is returned to data of the original description system.

When the recording waveform sequence has not been subjected to RLL modulation and NRZI modulation, NRZI demodulator 101 and RLL demodulator 102 shown in FIG. 8 are not necessary and a demodulation circuit in accordance with the recording waveform sequence is appropriately provided, as shown in FIG. 4B.

Figure 9:
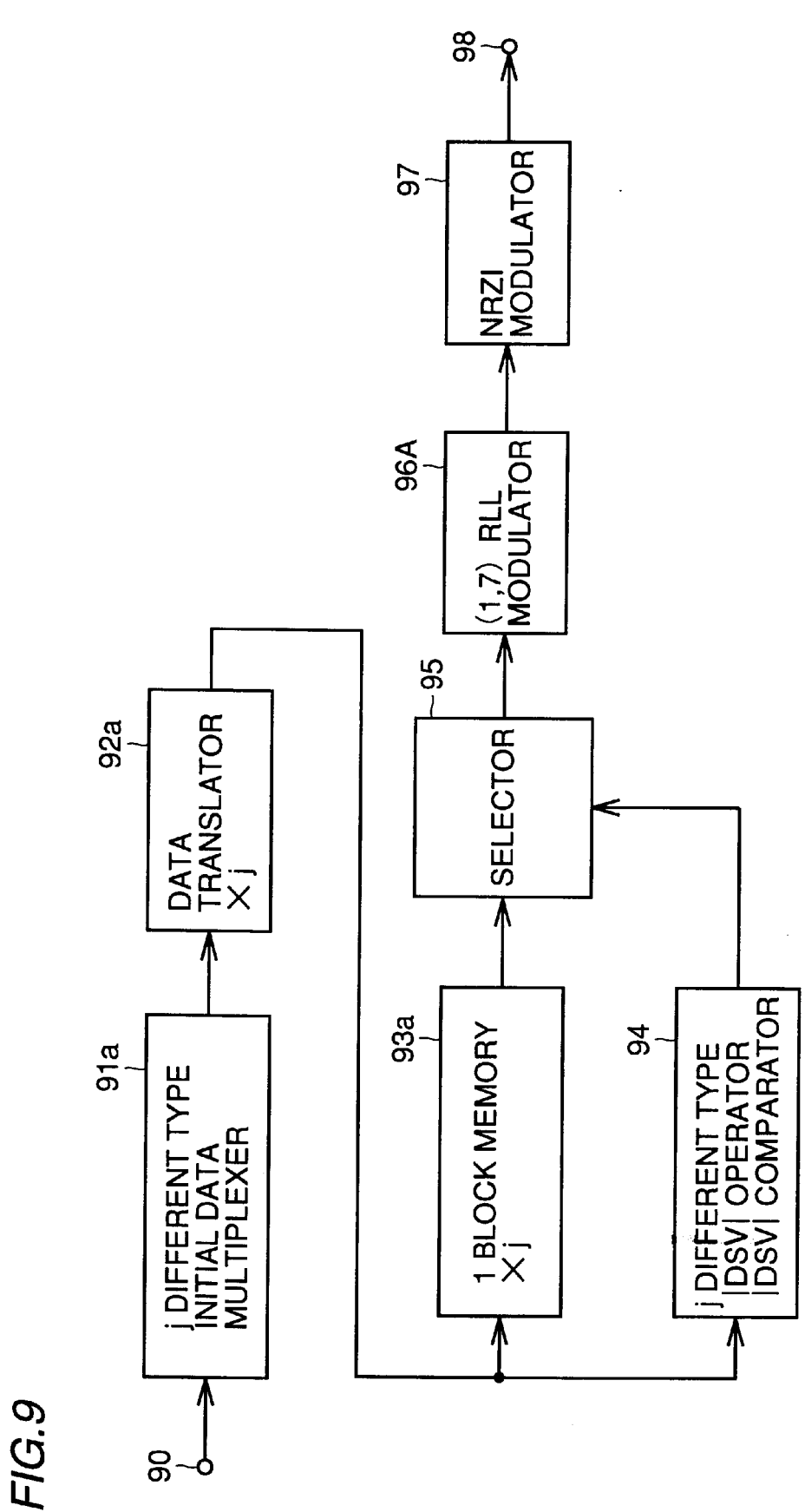
FIG. 9 is a block diagram showing another specific example of the modulator.

FIG. 9 shows another specific example of a modulator, which is a modification of FIG. 6. Namely, as a specific example of RLL modulator 96 shown in FIG. 6, (1, 7) RLL modulator 96A is used. In the embodiment shown in FIG. 9, absolute values of DSV when (1, 7; 2, 3) RLL modulation and NRZI modulation are performed are compared with each other, and a translated block data having minimum absolute value of DSV is selected. Here, the absolute value of DSV to be compared may be a value at the last bit of the translated block data, for example, or it may be the absolute value of maximum amplitude within the translated block data.

Figure 10:
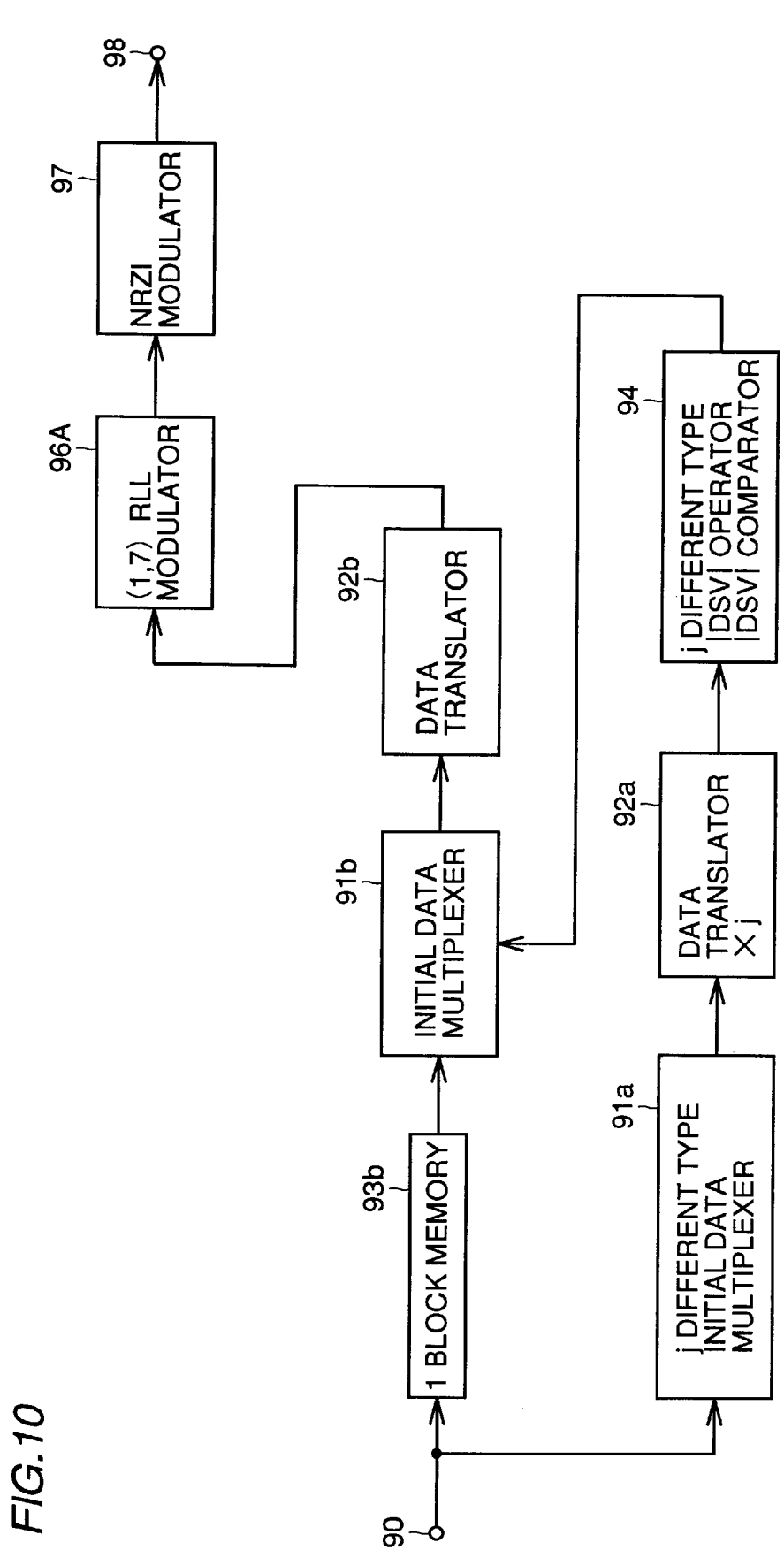
FIG. 10 is a block diagram showing a still further example of the modulator.

FIG. 10 shows a still further specific example, which is a modification of FIG. 7. More specifically, in place of RLL modulator 96 shown in FIG. 7, an RLL modulator 96A is provided, and absolute values of DSV after (1, 7; 2, 3) RLL modulation and NRZI modulation are compared with each other by j different type |DSV| operator·comparator 94, and a translated block data having minimum absolute value of DSV is detected. The initial data (translation number Tj) for the detected translated block is selected, and the result of selection is applied to initial data multiplexer 91b.

Figure 11:
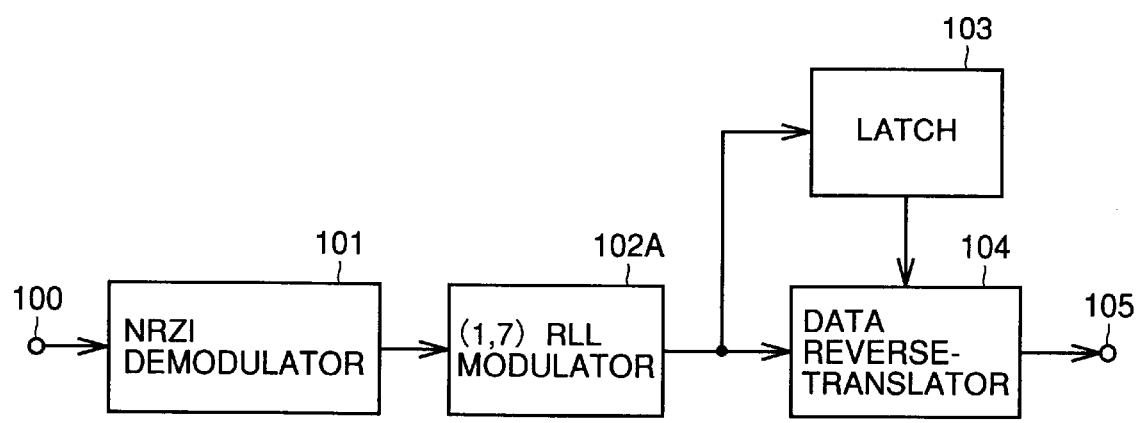
FIG. 11 shows another specific example of the demodulator.

FIG. 11 shows another specific example of a demodulator, showing an example of the demodulator of FIG. 8. Namely, in place of RLL demodulator 102 shown in FIG. 8, an (1, 7) RLL demodulator 102A is used. The input data is first applied to NRZI demodulator 101 to be subjected to NRZI demodulation and thereafter to (1, 7) RLL demodulator 102A to be subjected to RLL demodulation. The RLL demodulated data (pre-reverse-translation data) are applied to latch 103 and held therein, as well as to data reverse-translator 104.

In data reverse translator 104, from delayed data input from latch 103 (immediately preceding demodulation code unit) and data which is the object of reverse-translation input from (1, 7) RLL demodulator 102A (current demodulation code unit), reverse-translation in accordance with convolution operation described above is performed. Thus the data are returned to the data of the original description system.

Figure 12:
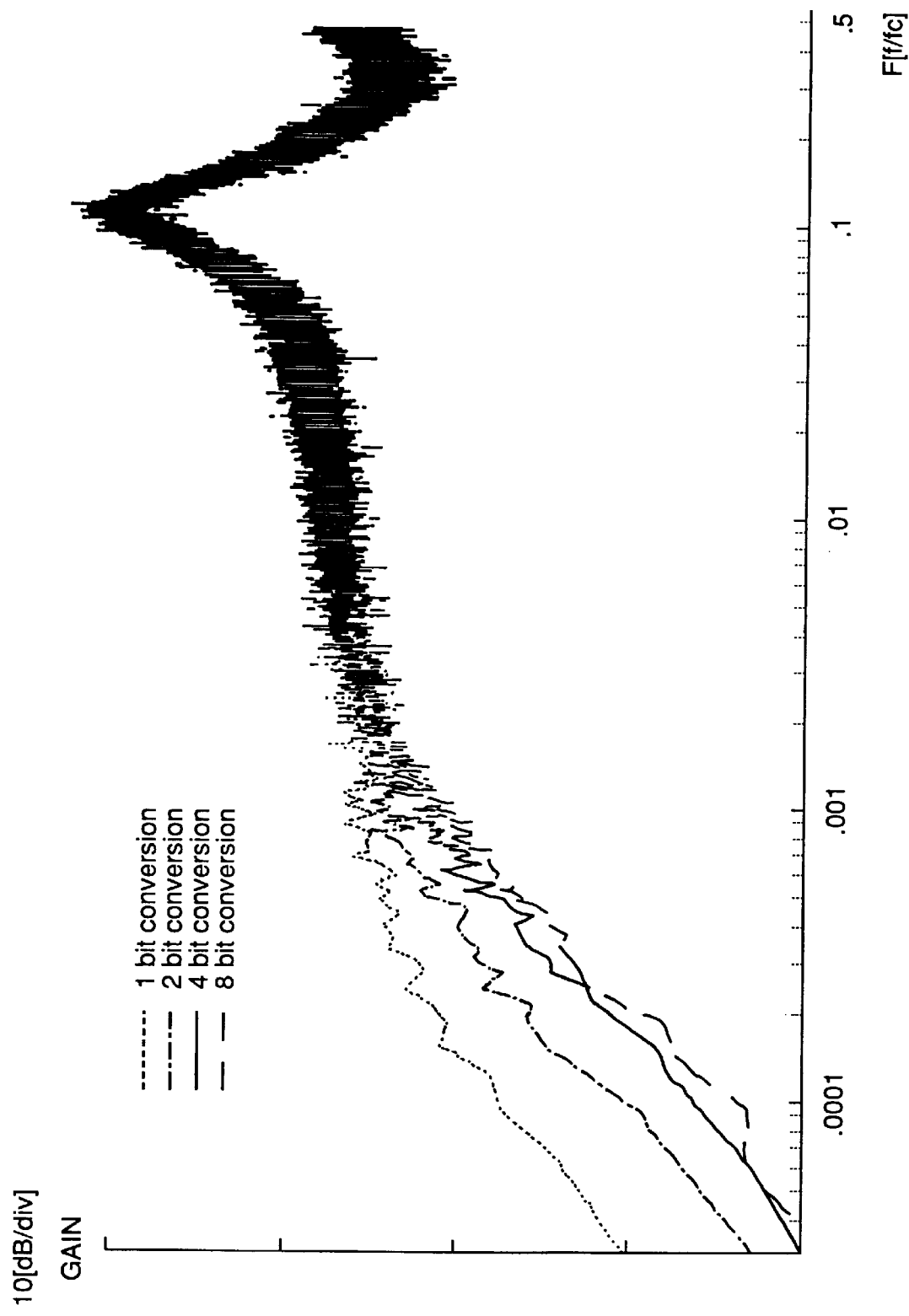
FIG. 12 is a graph representing effect of suppression of DC component when initial data Tj having bit number t of 1, 2, 4 and 8 bits for the convolution operation are distributed as shown in FIGS. 5A to 5D to be added to the input block of 80 bytes and (2, 7; 1, 2) RLL modulation is performed.
Figure 13:
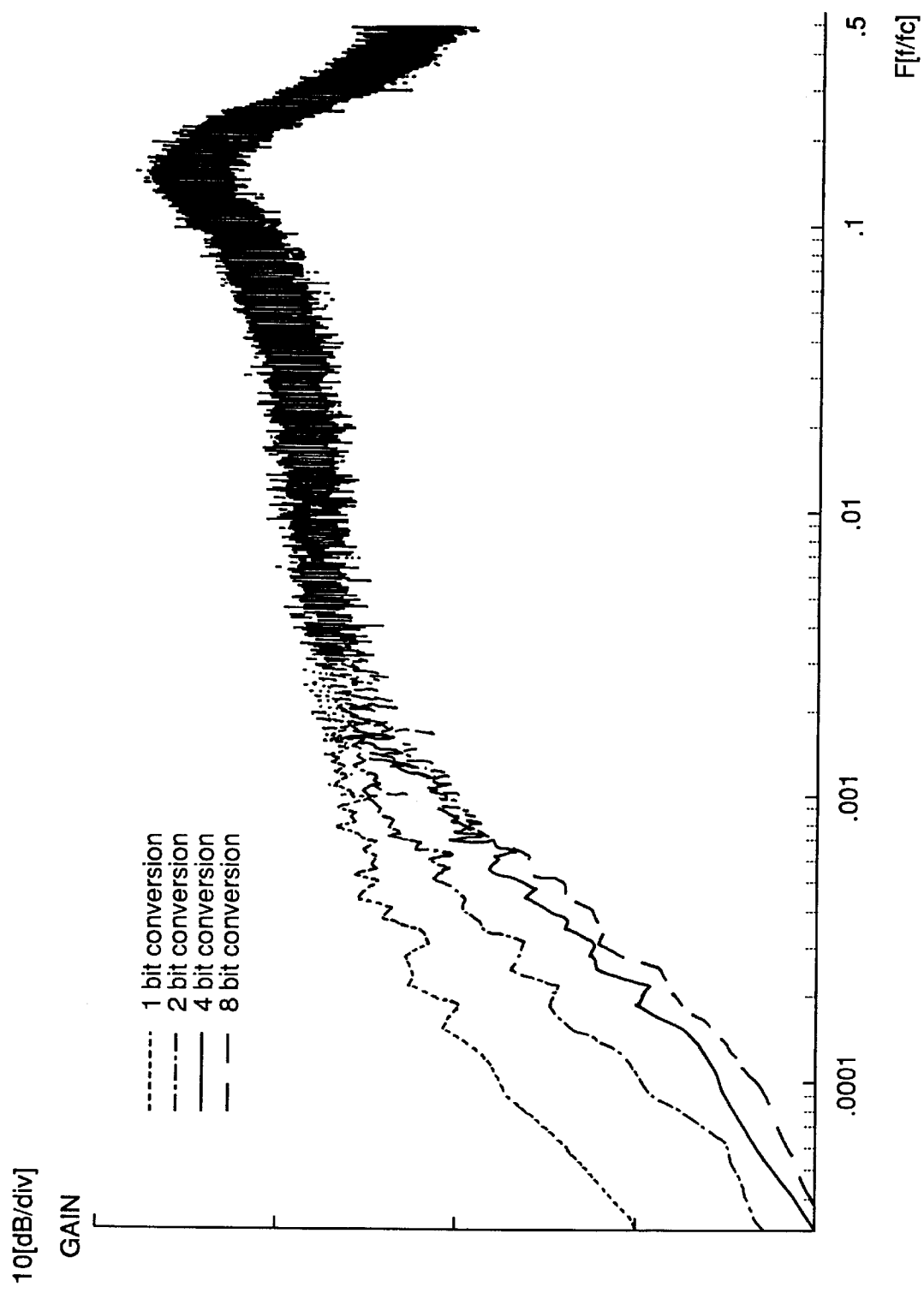
FIG. 13 is a graph representing effect of suppression of DC component when (1, 7; 2, 3) RLL modulation is performed.

FIG. 12 is a graph representing the effect of suppression of the DC component when initial data Tj having the bit number t of 1, 2, 4 and 8 bits respectively for the convolution operation are added to the input block of 80 bytes as shown in FIGS. 5A to 5D and (2, 7; 1, 2) RLL modulation is performed, and FIG. 13 is a graph representing the effect of suppression of the DC component when (1, 2; 2, 3) RLL modulation is performed in the similar manner.

Figure 14:
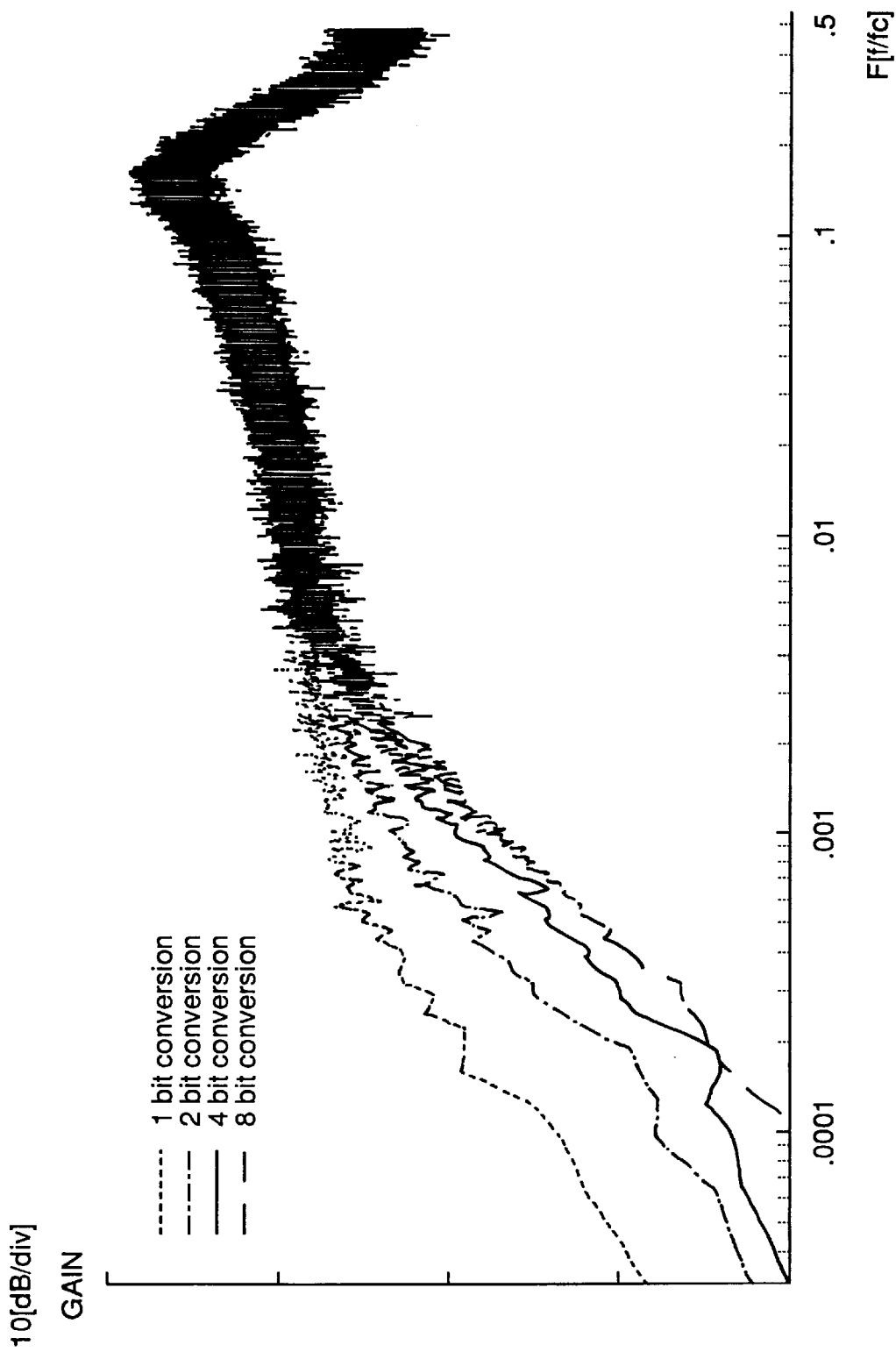
FIG. 14 is a graph representing effect of suppressing DC component when initial data Tj having bit number t of 1, 2, 4 and 8 bits for convolution operation are distributed as shown in FIGS. 5A to 5D and added to the input block of 40 bytes, and (1, 7; 2, 3) RLL modulation is performed.

FIG. 14 is a graph representing the effect of suppressing the DC component when initial data Tj having the bit number t of 1, 2, 4 and 8, respectively of initial data Tj for convolution operation are added to the input block of 40 bytes as shown in FIGS. 5A to 5D and (1, 7; 2, 3) RLL modulation is performed.

Figure 15:
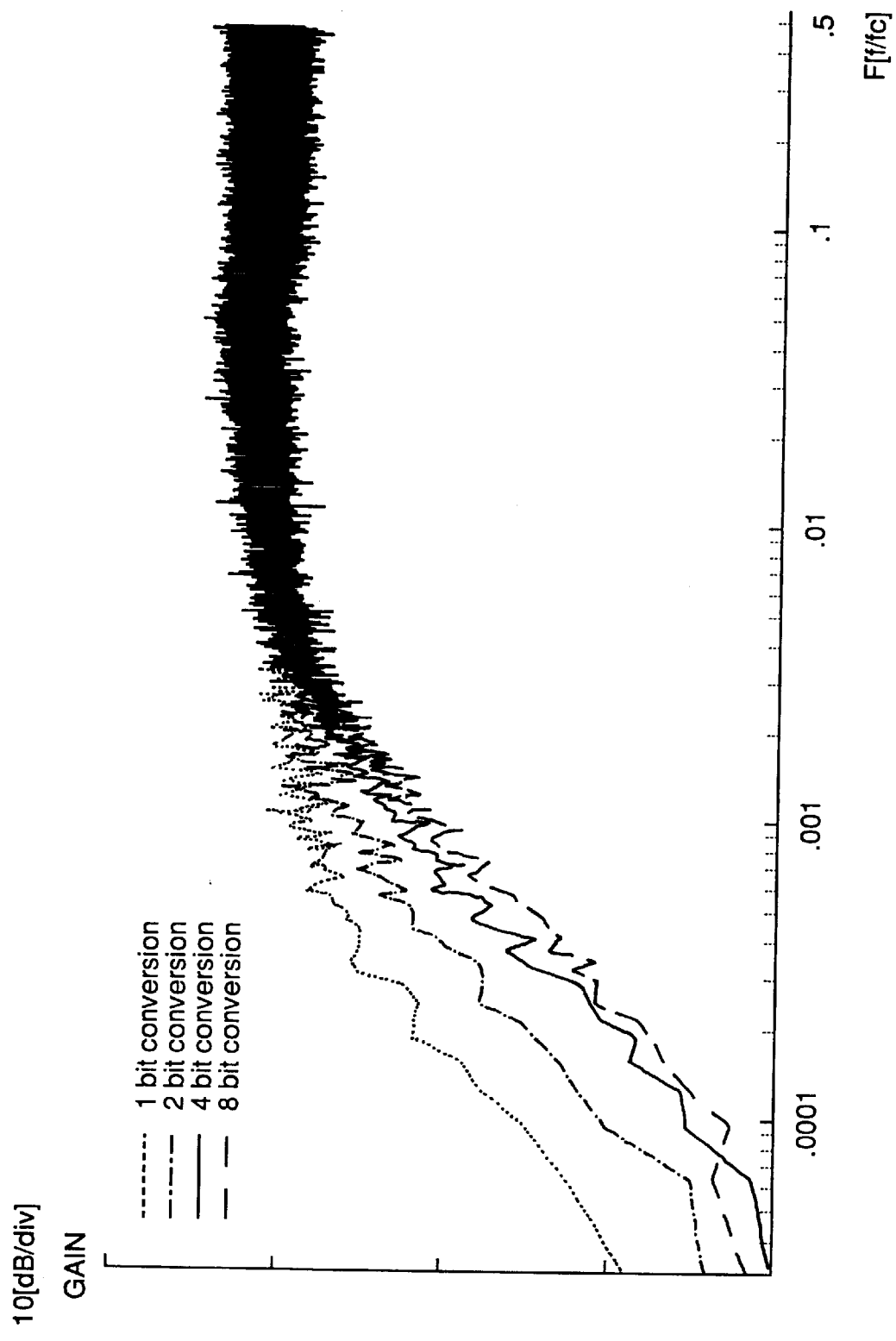
FIG. 15 is a graph representing effect of suppressing DC component when initial data Tj of bit number t of 1, 2, 4 and 8 bits for convolution operation are distributed as shown in FIGS. 5A to 5D and added to the input block of 80 bytes, and RLL modulation is not performed.

FIG. 15 is a graph representing the effect of suppressing the DC component when initial data Tj having the bit number t of 1, 2, 4 and 8 bits, respectively, of initial data Tj for the convolution operation are added to the input block of 80 bytes as shown in FIGS. 5A to 5D and RLL modulation is not performed.

Figure 16:
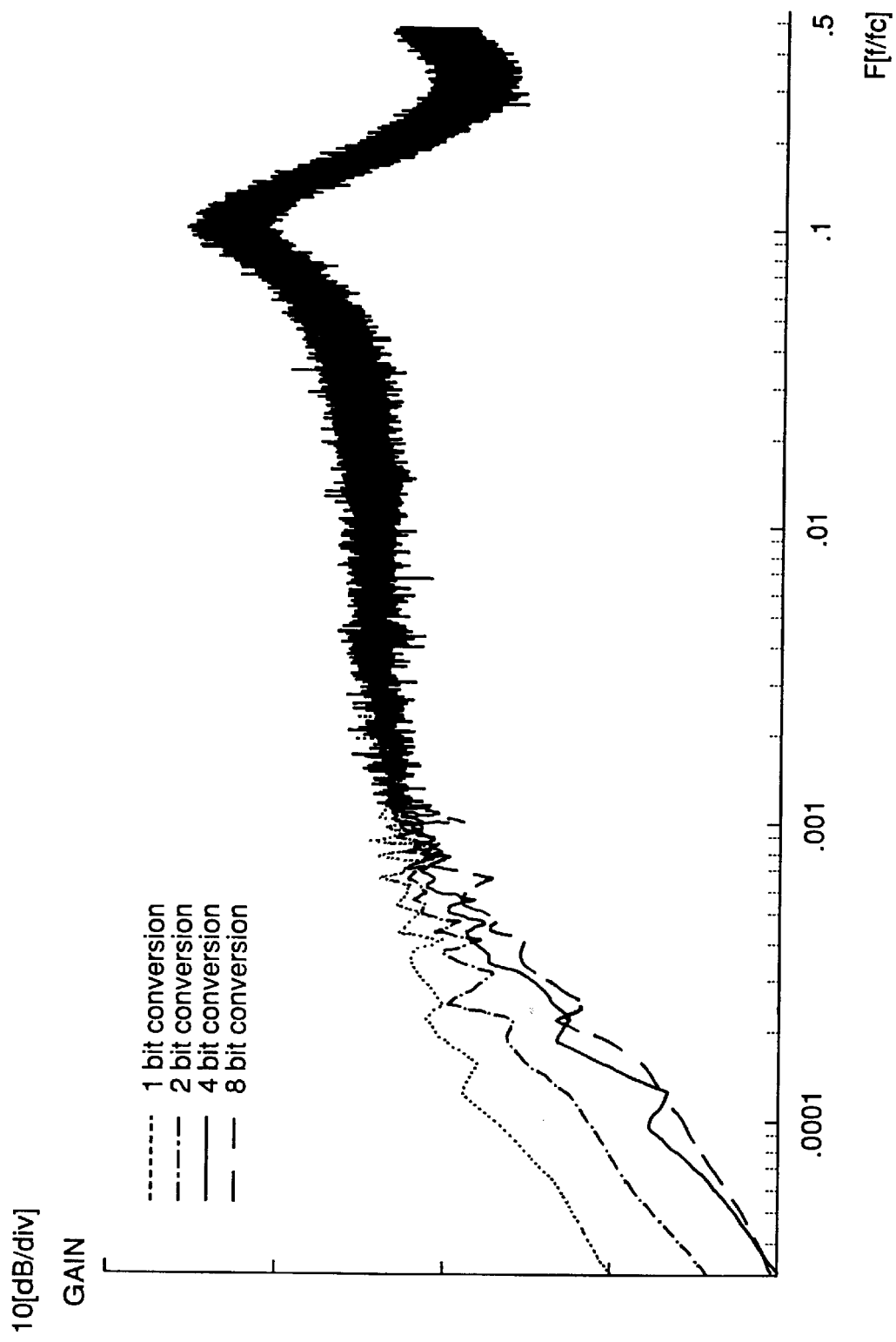
FIG. 16 is a graph representing effect of suppressing DC component when initial data Tj having the bit number t of 1, 2, 4 and 8 bits for convolution operation are distributed as shown in FIGS. 5A to 5D and added to the input block of 160 bytes, and (2, 9; 8, 15) RLL modulation is performed.

FIG. 16 is a graph representing the effect of suppressing the DC component when initial data Tj having the bit number t of 1, 2, 4 and 8 bits respectively of initial data Tj for convolution operation are added to the input block of 160 bytes as shown in FIGS. 5A to 5D and (2, 9; 8, 15) RLL modulation is performed.

Figure 17:
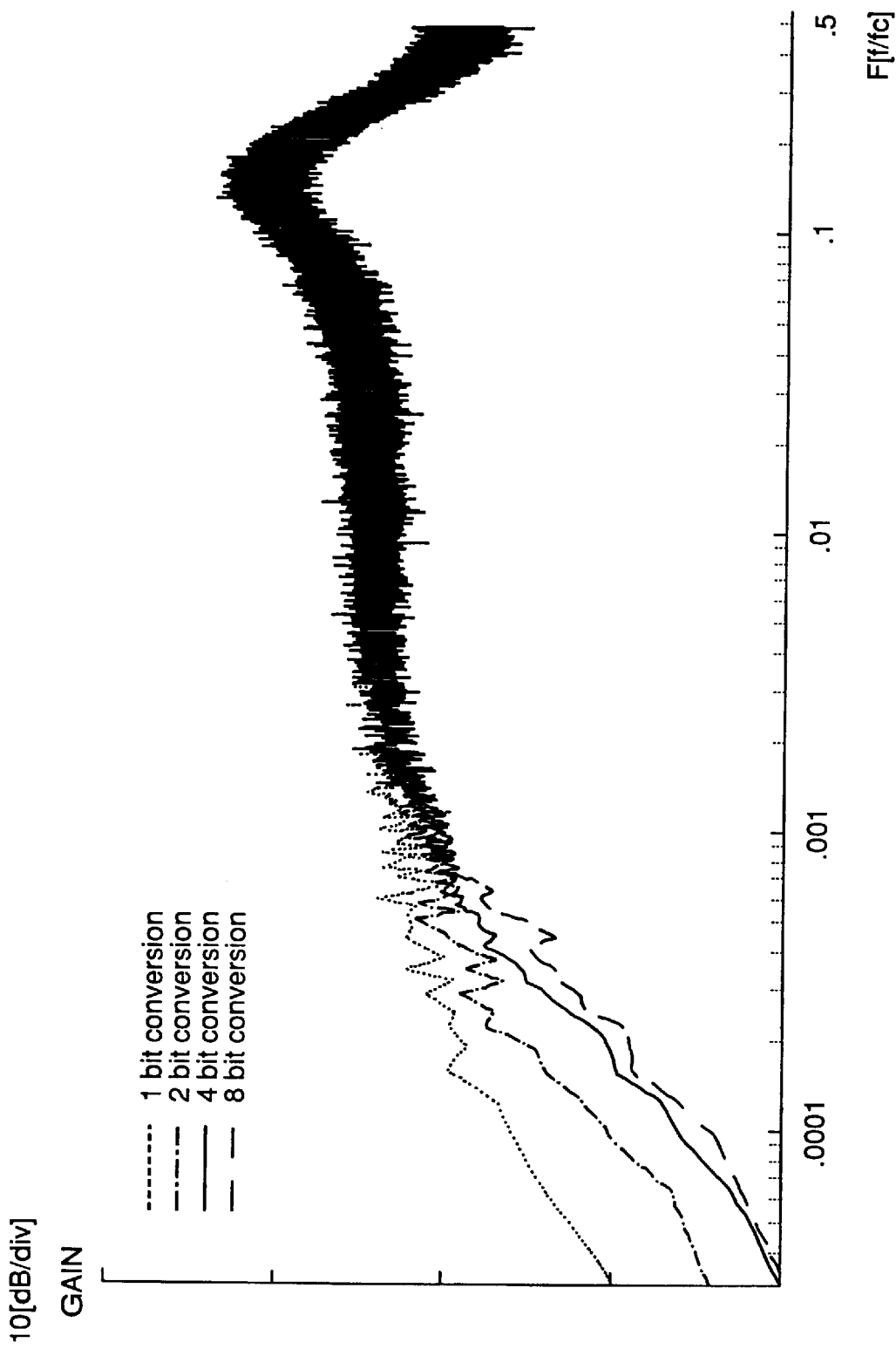
FIG. 17 is a graph representing effect of suppressing DC component when (1, 7; 2, 3) RLL modulation is performed in the similar manner.

FIG. 17 is a diagram showing the effect of suppressing the DC component when initial data Tj having the bit number of 1, 2, 4 and 8 bits, respectively for convolution operation are added to the input block of 160 bytes as shown in FIGS. 5A to 5D and (1, 7; 2, 3) RLL modulation is performed.

Figure 18:
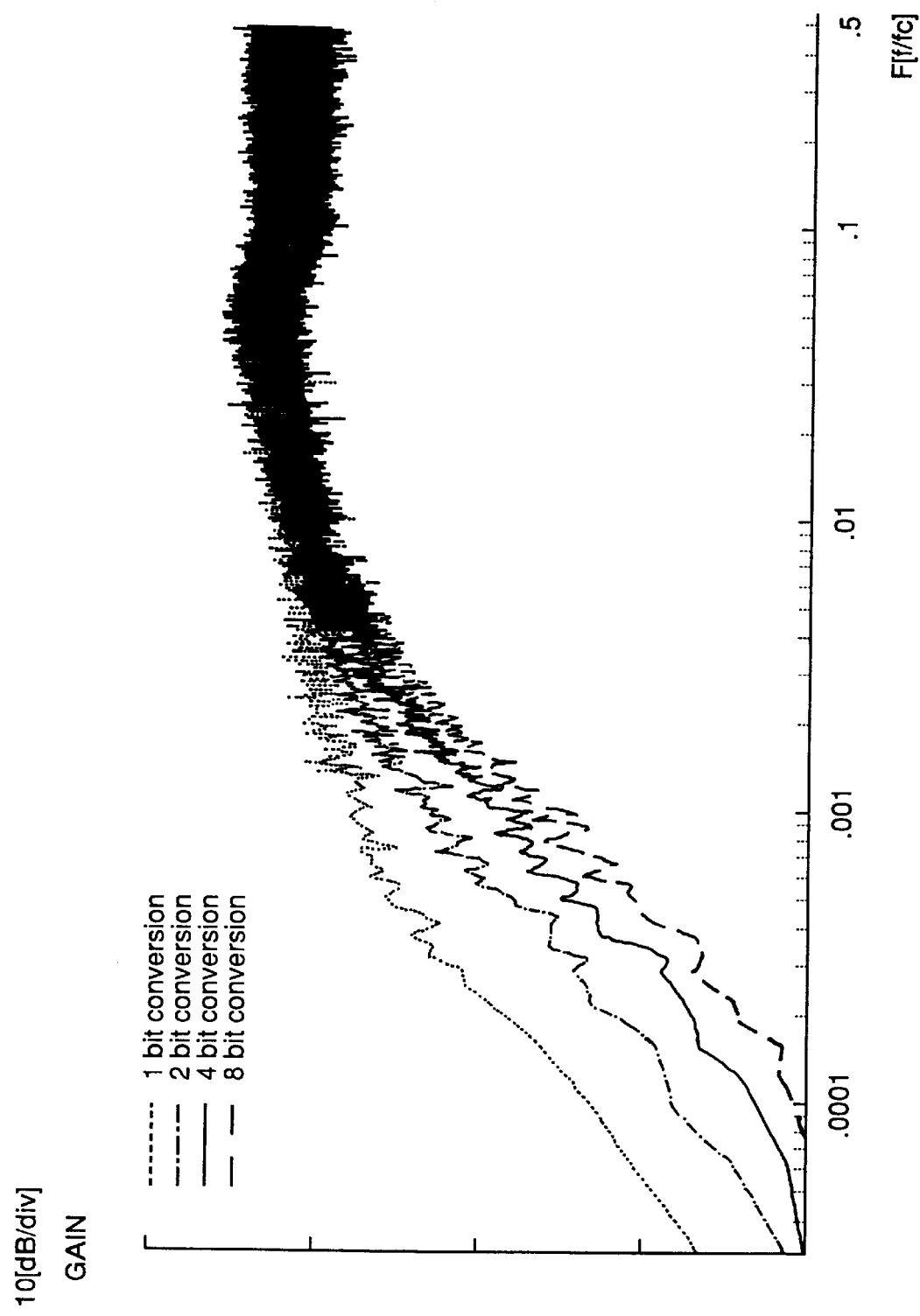
FIG. 18 is a graph representing effect of suppressing DC component when initial data Tj having bit number t of 1, 2, 4 and 8 bits for convolution operation are added to the input block of 40 bytes and RLL modulation is not performed.

FIG. 18 is a graph representing the effect of suppressing the DC component when initial data Tj having bit number t of 1, 2, 4 and 8 bits respectively for convolution operation are added to the input block of 40 bytes as shown in FIGS. 5A to 5D, and RLL modulation is not performed.

Figure 19:
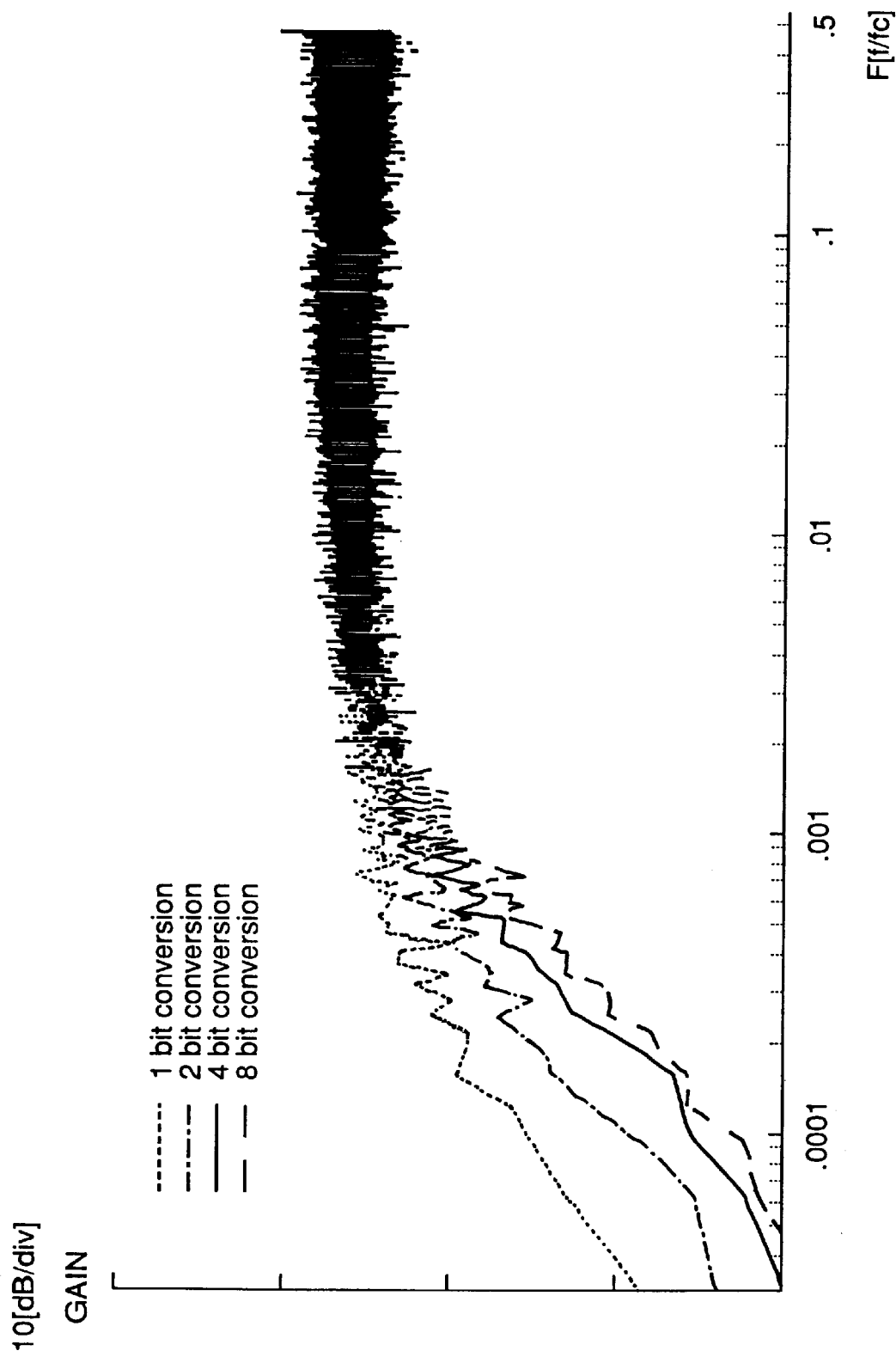
FIG. 19 is a graph representing effect of suppressing DC component when initial data Tj having bit number t of 1, 2, 4 and 8 bits for convolution operation are added to the input block of 160 bytes and RLL modulation is not performed.

FIG. 19 is a graph representing the effect of suppressing the DC component when initial data Tj having the bit number t of 1, 2, 4 and 8 bits for convolution operation are added to the input block of 160 bytes and RLL modulation is not performed.

Figure 20:
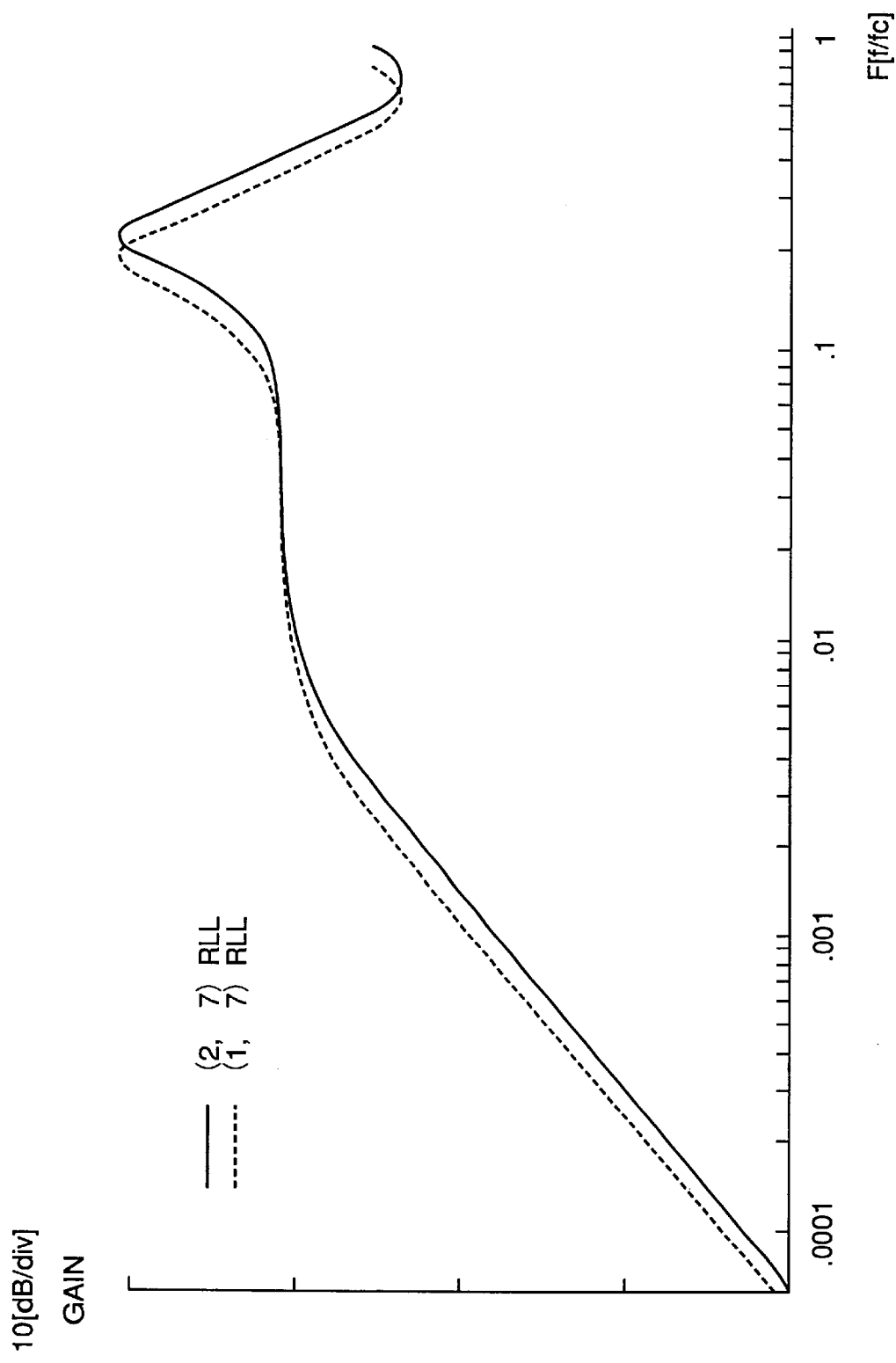
FIG. 20 is a graph representing effect of suppressing high frequency component, when initial data Tj having bit number t of 8 bits for convolution operation is added to an input block of 80 bytes and (2, 7; 1, 2) RLL modulation is performed, and when (1, 7; 2, 3) RLL modulation is performed, with the abscissa normalized by a data bit frequency fb.

FIG. 20 is a graph representing the effect of suppressing high frequency component, when initial data Tj having the bit number t of 1, 2, 4 and 8 bits respectively for the convolution operation are added to the input block of 80 bytes and (2, 7; 1, 2) RLL modulation is performed (solid line) and (1, 7; 2, 3) RLL modulation is performed (dotted line), with the abscissa normalized by data bit frequency fb.

As is apparent from FIGS. 12 to 19, in accordance with the embodiments, it is apparent that when the bit number is 2 and further 4 and 8, the effect of suppressing the DC component can be improved as compared with the bit number t of 1 of the initial data Tj for the convolution operation.

Further, as represented by the dotted line in FIG. 20, it is clear that (2, 7; 1, 2) RLL modulation represented by the solid line has higher effect of suppressing the DC component than (1, 7; 2, 3) RLL modulation.

A plurality of different types of multiplexed blocks (pre-translation block data) provided by adding a plurality of different types of t bit data at the head of input blocks are translated by a plurality of different types of translated block data by convolution operation, DC components of these data are compared, and a translated block data having the minimum DC component is selected, whereby the DC component can sufficiently be suppressed, and recording density when the data sequence is recorded on a recording medium can be improved.

What is claimed is:

1. A digital modulation circuit utilizing m-n modulation system for translating an arbitrary sequence of m bits to an arbitrary sequence of n bits (where n≧m) in one to one correspondence, for m-n modulating, using every m bits of input digital data as a code modulation unit, every m bits to modulated data of n bits each, comprising:

multiplexing means for multiplexing each of a plurality of different types of t-bit data as initial data on a head of p-bit input block data consisting of a prescribed number of data translation unit (t bits) for producing a plurality of different types of pre-translation block data;

data translating means for performing, for each of said plurality of different types of pre-translation block data, an exclusive OR operation on t bits at the head of each of said plurality of different types of pre-translation block data and immediately following t bits, replacing said immediately following t bits by the result of operation, performing an exclusive OR operation on said replaced t bits and immediately following t bits and replacing said immediately following t bits by the result of operation, and thereafter executing convolution operation including said exclusive OR operation and said replacing until the end of each of said plurality of different types of pre-translation block data for producing a plurality of different types of translation block data from said plurality of different types of pre-translation block data;

calculating means for calculating each of DC components of respectively modulated block data obtained by m-n modulation of each of the plurality of different types of translated block data translated by said data translating means;

comparing means for comparing magnitude of absolute value of respective DC components calculated by said calculating means with each other;

selecting means for selecting said initial data corresponding to that modulated block data which has a small absolute value of the DC component compared by said comparing means; and modulating means for producing m-n modulated block data corresponding to the pre-translation block data multiplexed with the initial data selected by selecting means.

2. The digital modulation circuit according to claim 1 wherein said selecting means selects the initial data corresponding to that modulated block data which has minimum absolute value of the accumulated value of the DC component at the last bit of said modulated block data.

3. The digital modulation circuit according to claim 1, wherein said selecting means selects the initial data corresponding to that modulated block data which has minimum absolute value of maximum amplitude of the an accumulated value of the DC component of said modulated block data.

4. The digital modulation circuit according to claim 1, further comprising a memory for storing each of said plurality of different types of translated block data; wherein said modulating means performs m-n modulation by reading that translated block data which corresponds to the initial data selected by said selecting means from said memory.

5. The digital modulation circuit according to claim 1, further comprising:

a memory for storing said input block data;

second multiplexing means for reading input block data from said memory and multiplexing initial data selected by said selecting means; and second data translating means for performing, for the pre-translation block data output from said second multiplexing means, an exclusive OR operation on t bits at the head and immediately following t bits and replacing said immediately following t bits by the result of operation, performing an exclusive OR operation on the replaced t bits and immediately following t bits and replacing said immediately following t bits by the result of operation, and thereafter in the similar manner executing convolution operation including said exclusive OR operation and said replacing until the end of said pre-translation block data output from said second multiplexing means for producing translated block data from the pre-translation block data output from said second multiplexing means; wherein said modulating means performs m-n modulation of the translated block data output from said second data translating means.

6. A digital modulation circuit, comprising:

multiplexing means for multiplexing each of a plurality of different types of initial data of t bits at a head of an input block of p bits which is an integer multiple of t bits cut out from an input bit stream, for producing a plurality of different types of multiplexed blocks;

first assigning means for initially assigning said initial data to a preceding variable, and thereafter assigning successively applied translated data of t bits;

second assigning means for assigning current data read t bits by t bits successively from the head, except for initial data of said multiplexed blocks to a current variable;

first operating means for performing an exclusive OR operation of said preceding variable and said current variable for producing translated data;

second operating means for applying the translated data produced by said first operating means to said first assigning means, and replacing said current data read successively from the head except for said initial data of said multiplexed blocks by said translated data;

DC component calculating means for calculating DC component of each of a plurality of different types of translated blocks produced from said plurality of different types of multiplexed blocks respectively by the processing of said first and second assigning means and said first and second operating means; and selecting means for comparing magnitude of absolute values of the DC components calculated by said DC component calculating means with each other, for selecting and externally outputting a translation block having the minimum magnitude.

7. A digital modulation circuit, comprising:

input block producing means for successively cutting out input blocks of p bits each which is an integer multiple of t bits, from an input bit stream;

initial data producing means for producing a plurality of different types of initial data of t bits;

first assigning means for initially assigning said initial data to a preceding variable, and thereafter assigning successively applied translated data of t bits;

second assigning means for assigning current data read t bits by t bits successively from the head of the input block cut out from said input block producing means, to a current variable;

first operating means for performing an exclusive OR operation on said preceding variable and said current variable for producing translated data;

second operating means for applying the translated data produced by said first operating means to said first assigning means, and replacing said current data read successively from the head of said input block by said translated data;

DC component calculating means for calculating DC component of each of a plurality of different types of translated blocks produced by executing, on each of said plurality of different types of initial data, processing of said first and second assigning means and said first and second operating means; and selecting means for comparing magnitude of absolute values of the DC components calculated by said DC component calculating means, and selecting and externally outputting a translation block having the minimum magnitude.

8. The digital modulation circuit according to claim 6, further comprising modulating means for modulating said translated block having the minimum magnitude to a recording signal block of a prescribed system; wherein said DC component calculating means calculates DC components when said plurality of different types of translated blocks are each modulated to said recording signal block; and said selecting means outputs selected said translated block having the minimum magnitude to said modulating means.

9. The digital modulation circuit according to claim 7, further comprising
  modulating means for modulating said translated block having the minimum magnitude to a recording signal block of a prescribed system; wherein
  said DC component calculating means calculates DC components when said plurality of different types of translated blocks are each modulated to said recording signal block; and
  said selecting means outputs selected said translated block having the minimum magnitude to said modulating means.

10. The digital modulation circuit according to claim 6 wherein said DC component calculating means calculates an accumulated value of the DC component at a last bit each of said plurality of different types of translated blocks.

11. The digital modulation circuit according to claim 7 wherein said DC component calculating means calculates an accumulated value of the DC component at a last bit of each of said plurality of different types of translated blocks.

12. The digital modulation circuit according to claim 6 wherein said DC component calculating means calculates maximum amplitude of an accumulated value of the DC component of each of said plurality of different types of translated blocks.

13. The digital modulation circuit according to claim 7 wherein said DC component calculating means calculates maximum amplitude of an accumulated value of the DC component of each of said plurality of different types of translated blocks.

* * * * *